United States Patent [19]
Muraoka et al.

[11] Patent Number: 5,854,745
[45] Date of Patent: Dec. 29, 1998

[54] METHOD AND APPARATUS FOR MOUNTING ELECTRONIC COMPONENT

[75] Inventors: Nobuhiko Muraoka, Toyonaka; Shinji Kanayama, Kashihara; Shinzo Eguchi, Hirakata; Masaru Ichihara, Kadoma; Shuichi Hirata, Moriguchi; Nobuhisa Watanabe, Kobe, all of Japan

[73] Assignee: Matsushita Electric Industrial Co., Ltd., Osaka-fu, Japan

[21] Appl. No.: 413,441

[22] Filed: Mar. 30, 1995

[30] Foreign Application Priority Data

| | | | |
|---|---|---|---|
| Mar. 30, 1994 | [JP] | Japan | 6-061627 |
| Mar. 30, 1994 | [JP] | Japan | 6-061628 |
| Mar. 30, 1994 | [JP] | Japan | 6-061629 |
| Mar. 30, 1994 | [JP] | Japan | 6-061630 |

[51] Int. Cl.$^6$ ...................................................... G06F 19/00
[52] U.S. Cl. ........................ 364/167.01; 29/720; 29/743; 348/87; 364/559
[58] Field of Search ............................. 364/167.01, 559, 364/488–491, 468.28, 468.21; 29/407.04, 720, 739–741, 743, 832–834; 348/87; 356/400, 401; 382/151

[56] References Cited

U.S. PATENT DOCUMENTS

| | | | |
|---|---|---|---|
| Re. 33,974 | 6/1992 | Asai et al. | 29/407 |
| 5,002,493 | 3/1991 | Brown et al. | 439/65 |
| 5,212,881 | 5/1993 | Nishitsuka et al. | 29/740 |
| 5,420,691 | 5/1995 | Kawaguchi | 348/87 X |

*Primary Examiner*—Joseph Ruggiero
*Attorney, Agent, or Firm*—Wenderoth, Lind & Ponack

[57] ABSTRACT

When an electronic component is picked up at an electronic component feeding part and then positioned and mounted at a predetermined mounting position on a transparent panel, mounting position marks formed at the mounting position on the transparent panel are registered with positioning marks formed on the electronic component, to thereby recognize the relative position from a surface opposite to a surface of the transparent panel where the electronic component is to be mounted, so that the position of the electronic component is corrected based on the result of the recognition before the electronic component is mounted at the predetermined mounting position on the transparent panel.

14 Claims, 32 Drawing Sheets

BLOCK 1

BLOCK 2

BLOCK 3

Fig. 28

| BLOCK NO. | X-COORDINATE | Y-COORDINATE | SIDE | SUR-FACE | ... |
|---|---|---|---|---|---|
| 1 | ... | ... | UPSIDE | FRONT | ... |
| 2 | ... | ... | DOWNSIDE | FRONT | ... |
| 3 | ... | ... | RIGHT | REAR | ... |
| ... | ... | ... | ... | ... | ... |

Fig. 35

| BLOCK NO. | X-COORDINATE | Y-COORDINATE | SV AXIS | ... |
|---|---|---|---|---|
| 1 | ... | ... | 90 | ... |
| 2 | ... | ... | 180 | ... |
| 3 | ... | ... | 0 | ... |
| ... | ... | ... | ... | ... |

0°

BLOCK 1

BLOCK 2

BLOCK 3

METHOD AND APPARATUS FOR MOUNTING ELECTRONIC COMPONENT

BACKGROUND OF THE INVENTION

The present invention relates to a method and an apparatus suitably fit for mounting electronic components to a transparent panel with high accuracy, particularly, for mounting an IC component driving a liquid crystal panel to a transparent panel constituting the liquid crystal panel.

In a production process of a liquid crystal panel, when an IC component composed of an IC chip mounted in a carrier film with outer leads is to be mounted to a glass panel constituting the liquid crystal panel in a manner that the outer leads are connected with transparent electrodes on the glass panel, conventionally, the following procedure has been conducted. The glass panel having an ACF (anisotropic conductive film) adhered along a side thereof where the IC component is to be mounted is positioned and held at a predetermined position. While a pair of marks indicating reference positions at both ends of the side of the glass panel are recognized by a recognition camera of a mounting head, the correct position of the glass panel is recognized. Thereafter, the IC component fed to a predetermined position for suction is sucked by the mounting head and transferred to a mounting position. In the middle of the transfer to the mounting position, a suction position where the IC component is drawn by suction is recognized as a positioning mark formed in the IC component by way of a recognition camera fixed at a suitable position. Accordingly, the IC component is correctly positioned at the mounting position on the glass panel and then mounted with pressure. In consequence of the procedure, a pressured portion of the ACF is turned conductive.

Referring to FIGS. 31 and 32, a glass panel 2 constituting a liquid crystal panel is positioned at a predetermined position by a holding means 133. A stage 134 supports a side of the glass panel 2 from below, more specifically, a side where an IC component is to be mounted on the positioned glass panel 2, while sustaining a pressuring force. The IC component 131 is supplied by a feed means 135 arranged in the rear of the holding means 133 to a predetermined feed position 136. A mounting head 137 movable in directions of three axes by a robot part 138 draws the IC component 131 thereto by suction at the feed position 136 and transfers it to a mounting position on the glass panel 2. The mounting head 137 is equipped with a tool 139 for sucking and pressuring the IC component 131 at the mounting position and also a recognition camera 140 and an illuminating means 141. A recognition camera 142 is arranged between the feed means 135 and stage 134. A ring illumination means 143 is arranged at the periphery of the camera 142.

Referring further to FIG. 33 showing a mounting process of the IC component 131 to the glass panel 2, first, the mounting head 137 is moved to the feed position 136 and the position of the IC component 131 held by suction is recognized by the recognition camera 140 (step S101). The mounting head 137 is positioned in agreement with the IC component 131, so that the IC component 131 is properly drawn by suction (steps S102 and S103). The IC component is then transferred over the recognition camera 142, and a positioning mark at each of the right and left sides of the IC component 131 is recognized by the recognition camera 142, whereby the correct position of the held IC component 131 is recognized (step S104). Subsequently, it is detected whether another glass panel 2 is supplied onto the holding means 133 (step S105). In the case where another glass panel 2 is supplied, a pair of reference position marks at both ends of a side of the new glass panel where the IC component is to be mounted are recognized by the recognition camera 140 of the mounting head 137. The mounting position for each IC component on the glass panel 2 is thus correctly recognized (step S10). Then, the IC component 131 sucked (or held) by the tool 139 is correctly positioned at the mounting position on the glass panel 2 (step S107). The IC component 131 is finally pressured and mounted to the glass panel 2 via the ACF when the tool 139 is descended (step S108). The above procedure is repeated for every required side of the glass panel 2 (step S109).

Meanwhile, in a production step of a color liquid crystal panel, it is necessary to mount the IC component with high accuracy, namely, ±10 μm or smaller because of the fine pitch of outer leads to the transparent electrodes on the glass panel 2.

In spite of the above requirement, however, since the mounting head 137 is moved a long distance after the position of the IC component 131, i.e., the positioning marks of the IC component 131 are recognized by the recognition camera 142 in the above-described conventional method, a robot part 138 accompanies a moving error and the recognition cameras 140 and 142 generate a relative positional error. This is because the recognition camera 140 of the mounting head 137 recognizes reference position marks on the glass panel 2, whereas the fixed recognition camera 142 recognizes the IC component 131. The conventional method was unable to achieve highly accurate mounting.

As shown in FIG. 34, the known holding means 133 for holding the glass panel 2 in the above mounting apparatus is often so constituted as to draw the glass panel 2 there to by means of suction pads 123 at four points in the vicinity of the corners of a panel placing surface 122. The suction pad 123 is generally of a circular shape in plan having a relatively shallow circular recess 125 and a suction port 124. The recess 125 is formed in the outer peripheral part of the pad 123 except for a contact surface 123a of a suitable width to be in touch with the glass panel 2. The suction port 124 at the center of the pad 123 is connected with a vacuum source. When the glass panel 2 is placed on the panel placing surface 122, the glass panel 2 is brought in contact with the contact surface 123a of each suction pad 123, so that the glass panel 2 is supported. At this time, the glass panel 2 shuts an upper opening of the recess 125. As the recess 125 becomes a compressed space when the inside air is discharged through the suction port 124, the glass panel 2 is consequently tightly suctioned and held by the suction pads 123.

However, when the pressure in the space of the recess 125 is reduced to surely suck and hold the glass panel 2 so as to avoid the positional shift of the glass panel 2, the suction force impresses a large bending stress to the glass panel 2 towards the inside of the recess 125, resulting in the distortion of the glass panel 2 to the inside of the recess 125, as shown in FIG. 21A. A liquid crystal panel using the distorted glass panel 2 is a defective product. This kind of problem is noticed not only in the liquid crystal panel, but when printed substrates or various electronic circuit boards which have been recently finely sophisticated are to be mounted or processed.

Regarding step S105 in FIG. 33, when a fresh glass panel 2 is fed, as shown in FIG. 27, a pair of reference position marks 2h, 2i provided at end parts of a side 2g of the glass panel 2 where the IC component is to be mounted are recognized by the recognition camera 140 of the mounting head 137, to thereby correctly recognize the holding position of the glass panel 2. The mounting position for each IC component is sometimes detected based on the above holding position of the glass panel 2. More specifically, data of the mounting position for each IC component 131 is represented by distances (a), (b), (c), . . . from a reference position indicated by the reference position mark 2h. Reference positions in the mounting data are corrected based on the recognized position of the reference position mark 2h. At the same time, an inclination of the glass panel 2 is calculated from the recognized positions of both reference position marks 2h and 2i. Positions separated by the distances (a), (b), (c), . . . in the inclining direction of the glass panel 2 are detected by using the recognized position of the reference position mark 2h as a reference. Each IC component 131 is mounted after the above separated positions are detected.

The above conventional method for detecting the mounting position in the mounting method is based on the assumption that the mounting pattern of each IC component in the glass panel 2 is accurate. While the mounting pattern of the glass panel 2 is actually accurate in size, there is such a problem that the mounting position in the data may be different from the actual mounting position due to the heat generated during the operation of a moving mechanism such as a ball screw of the robot part 138, etc. or the change of the ambient temperature, resulting in the registering accuracy being impossible to improve to ±15 μm or smaller. In other words, approximately 120 μm has been the minimum limit of the lead pitch of the electronic component.

As depicted hereinabove, most of errors in the conventional method result from the thermal shrinkage of the moving mechanism subsequent to the temperature change. Although the errors have been corrected by a linear scale, it complicates the structure of the apparatus, and the thermal shrinkage of the linear scale itself hinders the perfect temperature correction although the linear scale shrinks less than a moving mechanism such as a ball screw.

A plurality of electronic components for driving a liquid crystal panel are mounted sometimes along a required side among the four sides and the front and rear surfaces of the glass panel constituting the liquid crystal panel. In this case, the electronic components are mounted after the glass panel having the ACF adhered along the subject side is positioned at a predetermined position for mounting.

The mounting data to position the subject side of the glass panel at a predetermined position for mounting is, as shown in FIG. 35, constituted by an X-coordinate data, a Y-coordinate data, a rotary position data about a vertical axis (SV axis), and other data for every BLOCK when each BLOCK is formed corresponding to mounting of the electronic components to each side of the glass panel 2. The X-coordinate data and Y-coordinate data are positioning coordinates for the holding means 133.

As shown in FIGS. 36A–36D, in order to position and control the rotary position of the glass panel 2 when the electronic components are mounted, based on the above mounting data, the holding means 133 at a reference rotary position (0°) holds the supplied glass panel 2 (FIG. 36A), the holding means 133 is rotated 90° since the mounting data shows 90° at a BLOCK 1 (FIG. 36B), the holding means 133 is rotated further 90° since the mounting data is 180° at a BLOCK 2 (FIG. 36C), and the holding means 133 is rotated −180° since the mounting data is 0° at a BLOCK 3 (FIG. 36D). In other words, the mounting data to position the subject side of the glass panel 2 at the predetermined position regulates the rotary positions where the holding means 133 is to be positioned with respect to a reference rotary position of the holding means 133 which serves as an original point.

According to the mounting method using the mounting data as above, the rotary position of the holding means 133 is obtained for every block based on the subject side of the glass panel and the rotary position of the glass panels when carried into the mounting apparatus, to thereby form the mounting data for each mounting apparatus. Since a special instruction data becomes necessary for reversing the glass panel 2, it is troublesome to obtain the mounting data by the above mounting method.

SUMMARY OF THE INVENTION

The object of the present invention is therefore to provide a method and an apparatus for mounting electronic components with high accuracy while the tact time between mounting operations is kept short.

In order to achieve the aforementioned objective; the present invention is configured as will be described below.

In accomplishing these and other objects, according to a first aspect of the present invention, there is provided a method for mounting an electronic component to a transparent panel by picking up the electronic component at an electronic component feeding part and positioning and mounting the component at a predetermined mounting position on the transparent panel, wherein mounting position marks formed at the mounting position of the transparent panel are registered with positioning marks indicated in the electronic component, thereby to recognize a relative position from a surface opposite to a mounting surface of the transparent panel, so that a position of the electronic component is corrected based on a result of the recognition before the electronic component is mounted to the mounting position of the panel.

According to a second aspect of the present invention, there is provided the mounting method which comprises:

a step of recognizing a position of the electronic component sucked at the feeding part during transfer to the mounting position before the mounting position marks and positioning marks are recognized;

a step of recognizing a pair of reference position marks indicating a reference position to the mounting position and formed in the panel;

a correcting step of correcting a mounting position data for the electronic component from recognized positions of the pair of reference position marks and a recognized value of a distance between the reference position marks; and a positioning step of correcting the position of the electronic component based on a recognition result of the sucked position of the electronic component to a corrected mounting position, and thereby positioning the electronic component at the mounting position, the steps followed by a mounting step of the electronic component.

According to a third aspect of the present invention, there is provided the mounting method which further includes a step wherein, in mounting the electronic component by positioning an optional side of the panel at the predetermined mounting position, a side data specifying each side of the panel is used as the mounting data, thereby to control rotation or reversal of the panel based on the side data used in a current mounting process and a side data for a side to be processed at a next mounting process.

According to a fourth aspect of the present invention, there is provided an apparatus for mounting an electronic component, which comprises:

a feeding means for feeding the electronic component to a predetermined position for suction;

a holding means for holding a transparent panel where the electronic component is to be mounted and positioning the panel at a predetermined position for mounting;

a mounting head for sucking and transferring the fed electronic component to mount the component at a mounting position on the transparent panel;

an image recognizing means able to be positioned immediately below the mounting position on the transparent panel for each electronic component; and illuminating means capable of selectively casting a coaxial light and a scattered light as an illuminating light for recognition.

According to a fifth aspect of the present invention, there is provided an apparatus for mounting an electronic component, which comprises:

a feeding means for feeding an electronic component to a predetermined position for suction;

a holding means for holding a transparent panel where the electronic component is to be mounted and positioning the panel at a predetermined position for mounting;

a mounting head for sucking and transferring the fed electronic component to mount the component at a mounting position on the transparent panel;

a first image recognizing means and a coaxial light casting means able to be positioned immediately below the mounting position on the transparent panel; and a second image recognizing means and a scattered light casting means in the vicinity of the first image recognizing means.

According to a sixth aspect of the present invention, there is provided the mounting apparatus in which the holding means has a plurality of suction pads on a panel placing surface thereof where the transparent panel is placed, each suction pad having a recess formed at an upper surface thereof and connected to a vacuum source, the recess being constituted of grooves of a width not larger than 8 times a thickness of the transparent panel and forming a compressed shut space when the transparent panel is sucked.

According to a seventh aspect of the present invention, there is provided a mounting apparatus of an electronic component, comprising: a holding means for rotating or reversing a panel thereby to position an optional side of the panel at a predetermined mounting position to mount an electronic component; and a posture controlling means for controlling a rotary angle or reversal of the panel by a panel positioning means on the basis of a current side data and a side data of a next process.

BRIEF DESCRIPTION OF THE DRAWINGS

These and other objects and features of the present invention will become clear from the following description taken in conjunction with the preferred embodiments thereof with reference to the accompanying drawings, in which:

FIG. 28 is an explanatory diagram of the constitution of a mounting data in a sixth embodiment of the present invention;

FIG. 35 is an explanatory diagram of the constitution of a mounting data of a conventional example;

DETAILED DESCRIPTION OF THE PREFERRED EMBODIMENTS

Figure 1:
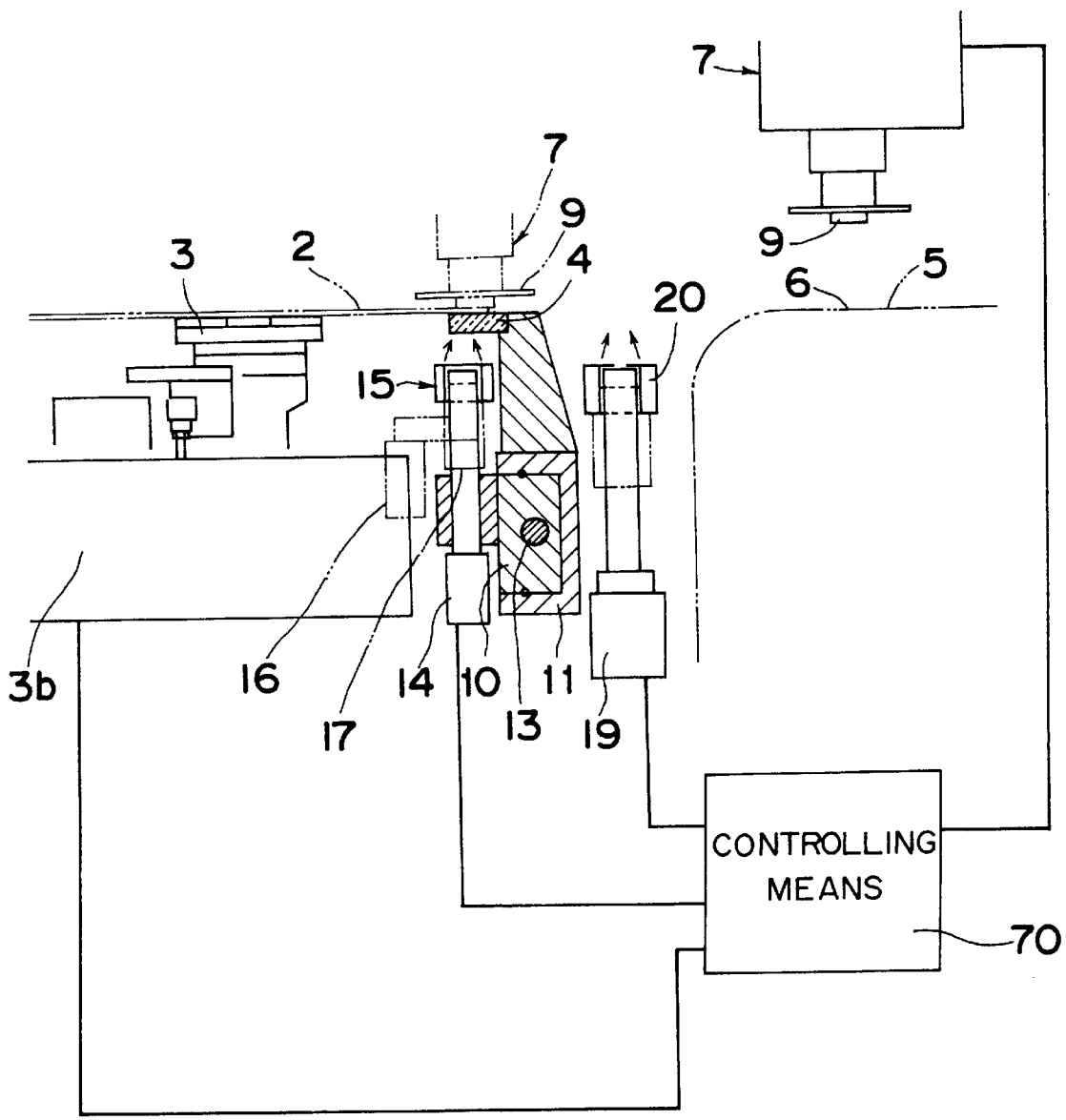
FIG. 1 is a side view, partly in section, which schematically shows the structure of part of an electronic component mounting apparatus in a first embodiment of the present invention.

Before the description of the present invention proceeds, it is to be noted that like parts are designated by like reference numerals throughout the accompanying drawings.

Figure 14:
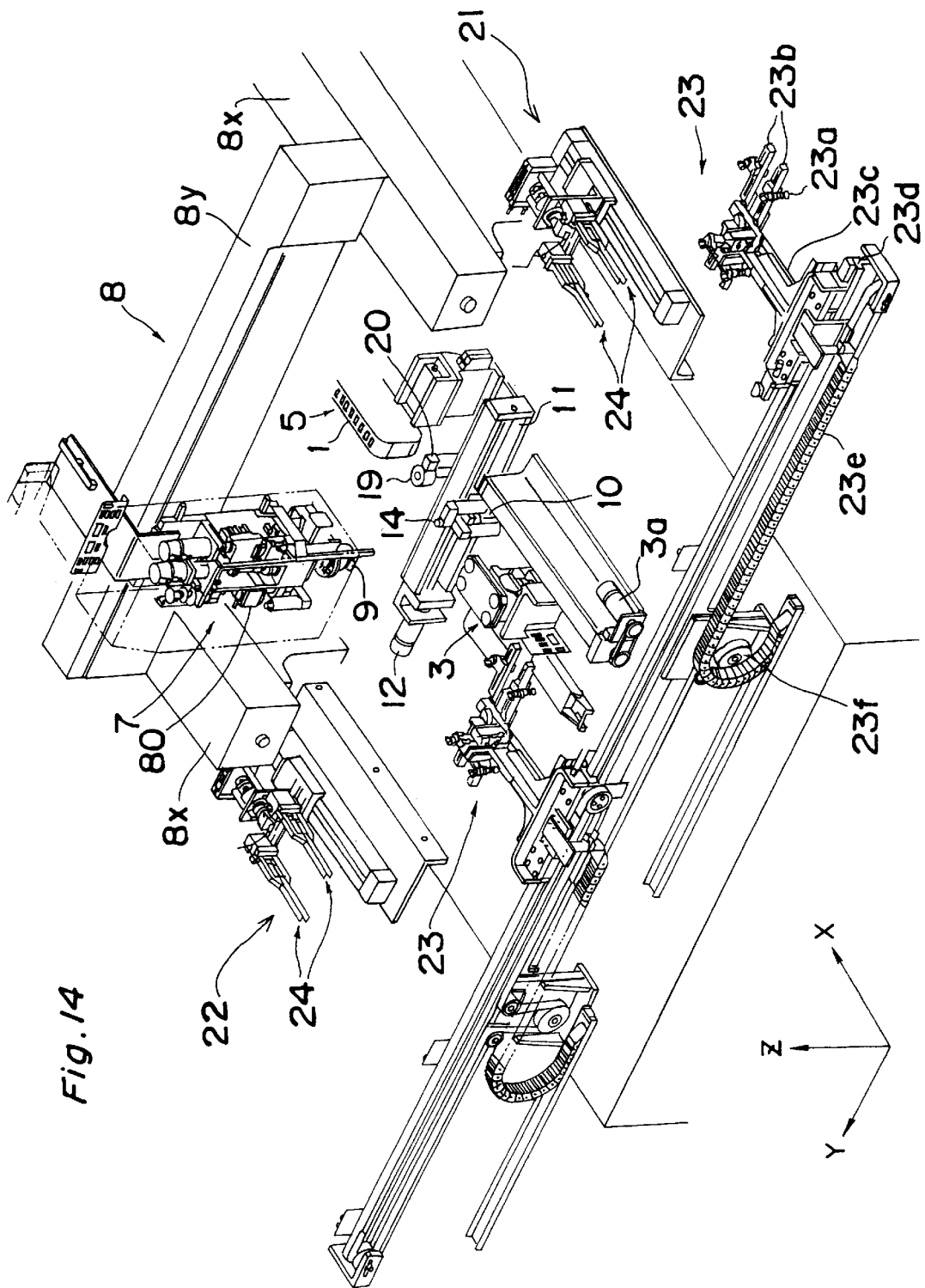
FIG. 14 is a perspective view schematically showing the whole of the electronic component mounting apparatus in the first embodiment.

A first embodiment of the present invention will be depicted with reference to FIGS. 1–9, 12–16 and 37. FIG. 14 is a perspective view of the whole of an apparatus for mounting electronic components in the first embodiment.

According to the first embodiment, electronic components of IC components (TAB components: Tape Automated Bonding components wherein IC components are carried and held on a film carrier) for driving a liquid crystal panel are mounted to a lateral side of a glass panel constituting the liquid crystal panel.

Figure 6:
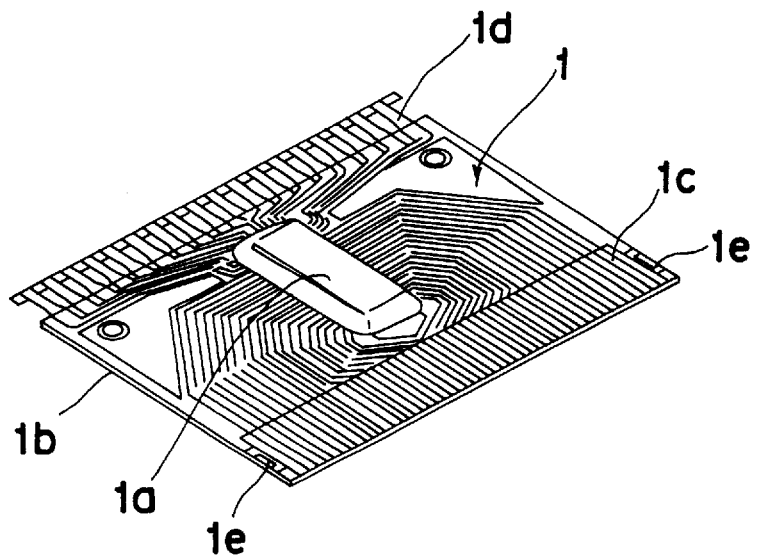
FIG. 6 is a perspective view of an electronic component in the first embodiment.
Figure 12:
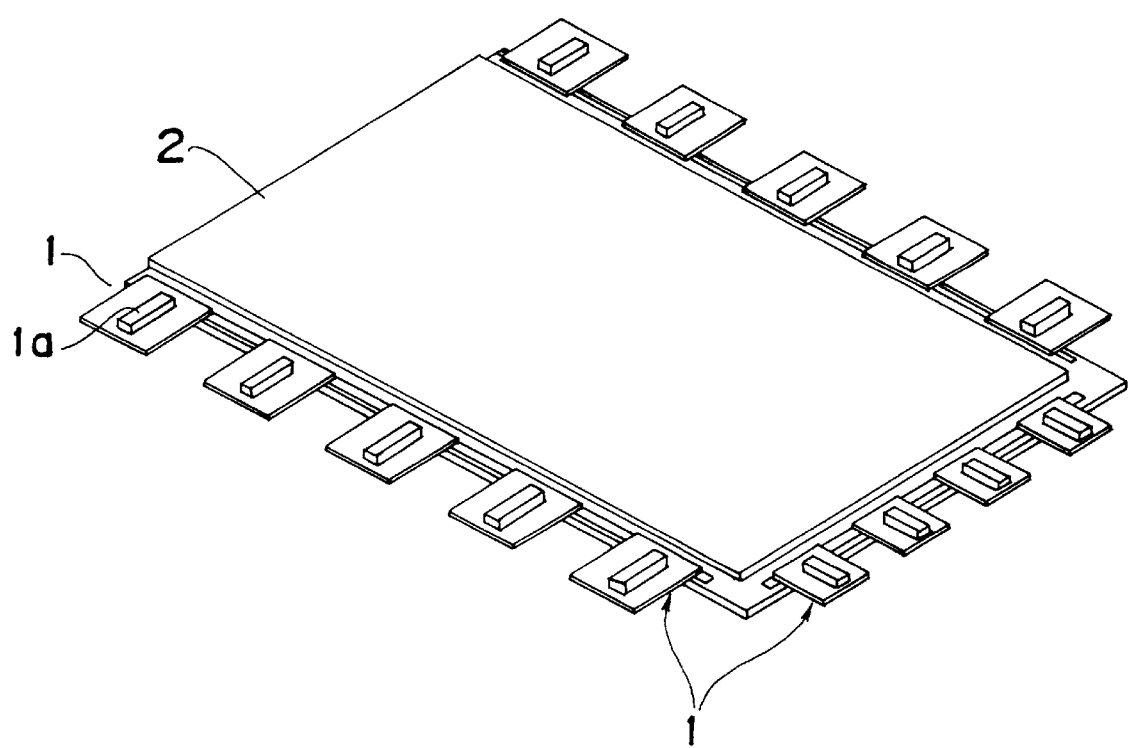
FIG. 12 is a perspective view of a liquid crystal panel constituted by mounting the electronic component of FIG. 6 to a glass panel.
Figure 13A:
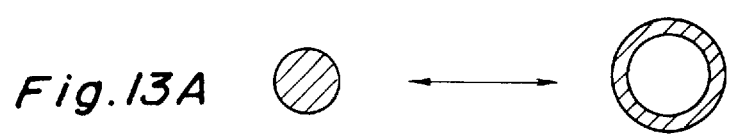
FIGS. 13A, 13B, 13C are explanatory diagrams of modified examples of the mounting position mark and positioning mark in the first embodiment, respectively.
Figure 13B:
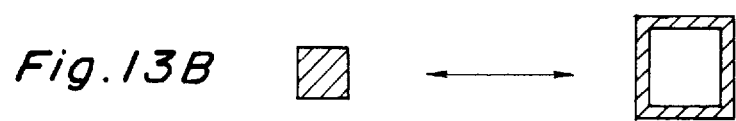
Figure 13C:
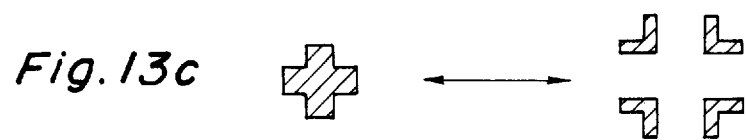

As shown in FIG. 6, an electronic component 1 has an inner lead and outer leads formed on a film carrier 1b beforehand. An IC chip 1a is set on the film carrier 1b. A bump of the IC chip 1a is bonded with the inner lead in a process called as ILB (inner lead bonding). The film carrier 1b, IC chip 1a, and inner lead are integrally sealed by resin to constitute the electronic component 1. An outer lead 1c and an outer lead 1d are respectively extended from two sides of the film carrier 1b. The outer lead 1c is bonded to a glass panel 2 as shown in FIG. 12, and the other outer lead 1d is bonded to a circuit board. Positioning marks 1e are provided at either end of the outer lead 1c in parallel to each other.

Figure 2:
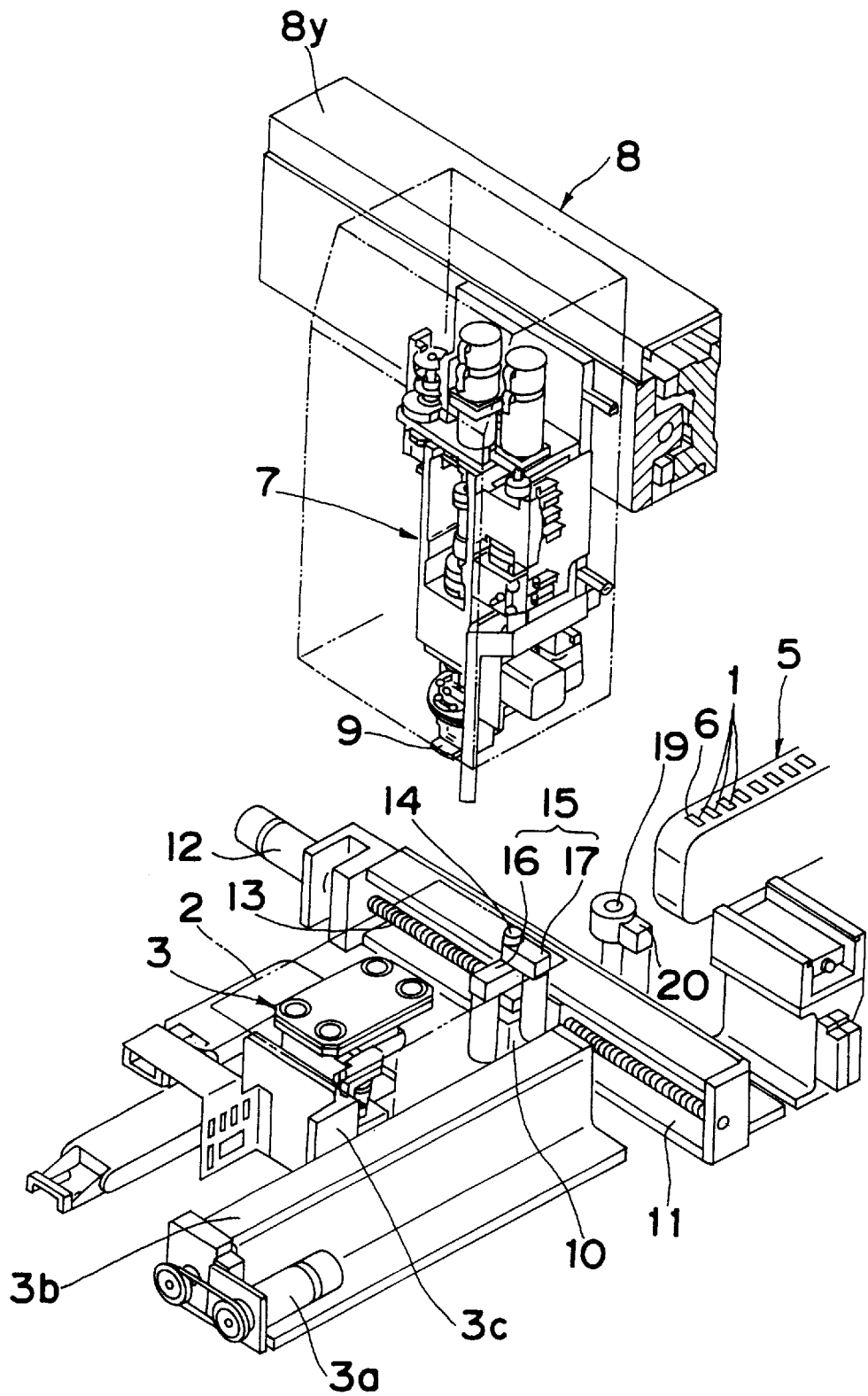
FIG. 2 is a perspective view, partly in section, of part of the mounting apparatus of FIG. 1.

Referring to FIGS. 1, 2, and 14, a holding means 3 for holding the glass panel 2 can be positioned at a predetermined position for mounting a lateral side of the glass panel 2 where the electronic component 1 is to be mounted.

The positioned lateral side of the glass panel 2 is supported from below by a stage 4 composed of a transparent glass plate. Therefore, the stage 4 sustains a pressure force when the electronic component is mounted to the glass panel 2. A feeding means 5 arranged in the back of the holding means 3 supplies the electronic components 1 which, for example, are stored in the recesses of a carrier tape, sequentially and continuously to a predetermined feeding position 6. A mounting head 7 is moved in directions of three axes (e.g., X, Y, and Z directions) orthogonal to each other by a robot part 8. The mounting head 7 sucks the electronic component 1 (i.e. draws the electronic component 1 thereto by suction) at the feeding position 6, transfers the sucked component 1 to a mounting position on the glass panel 2, and pressures and mounts the component 1 to the glass panel 2. The mounting head 7 has a tool 9 which sucks the electronic component 1 and, pressures the component 1 at the mounting position and releases the component 1. At the robot part 8, as is well known, a Y-axis driving part 8y holding the mounting head 7 is supported on a pair of X-axis driving parts 8x, so that the mounting head 7 is driven in the Y direction by the Y-axis driving part 8y and also driven in the X direction by the X-axis driving parts 8x. The mounting head 7 also operates to move the tool 9 in the Z direction.

A moving body 10 is arranged below the lateral side of the glass panel 2 positioned by the holding means 3 in a manner to be linearly movable in a direction parallel to the mounting position (Y direction in FIG. 14). The moving body 10 can be moved and positioned at an optional position by a feed screw mechanism 13 which is movably supported by a guide rail 11 and is driven by a driving motor 12. An image recognizing means 14 and an illuminating means 15 are set at the moving body 10 to recognize images of mounting position marks provided at the mounting position of the glass panel 2 which will be described later and images of the positioning marks 1e of the electronic component 1.

Figure 3A:
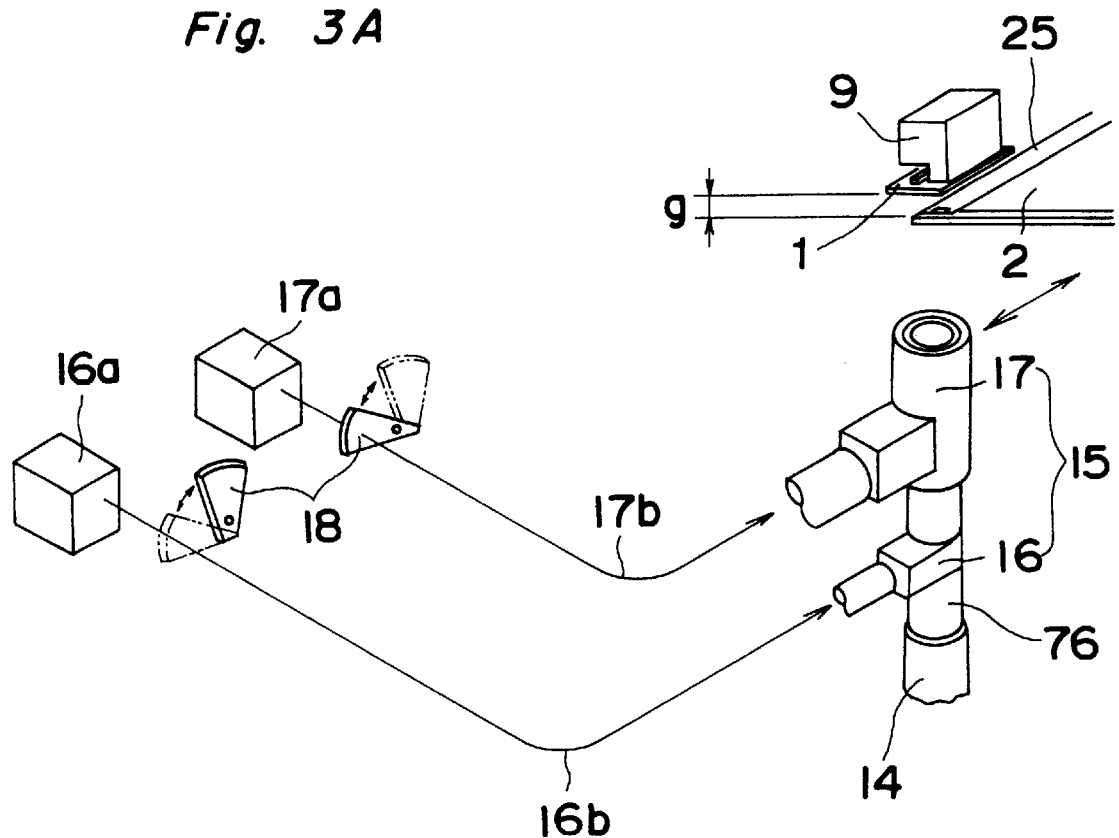
FIG. 3A is a schematic structural diagram of an illuminating means of the mounting apparatus of FIG. 1.
Figure 3B:
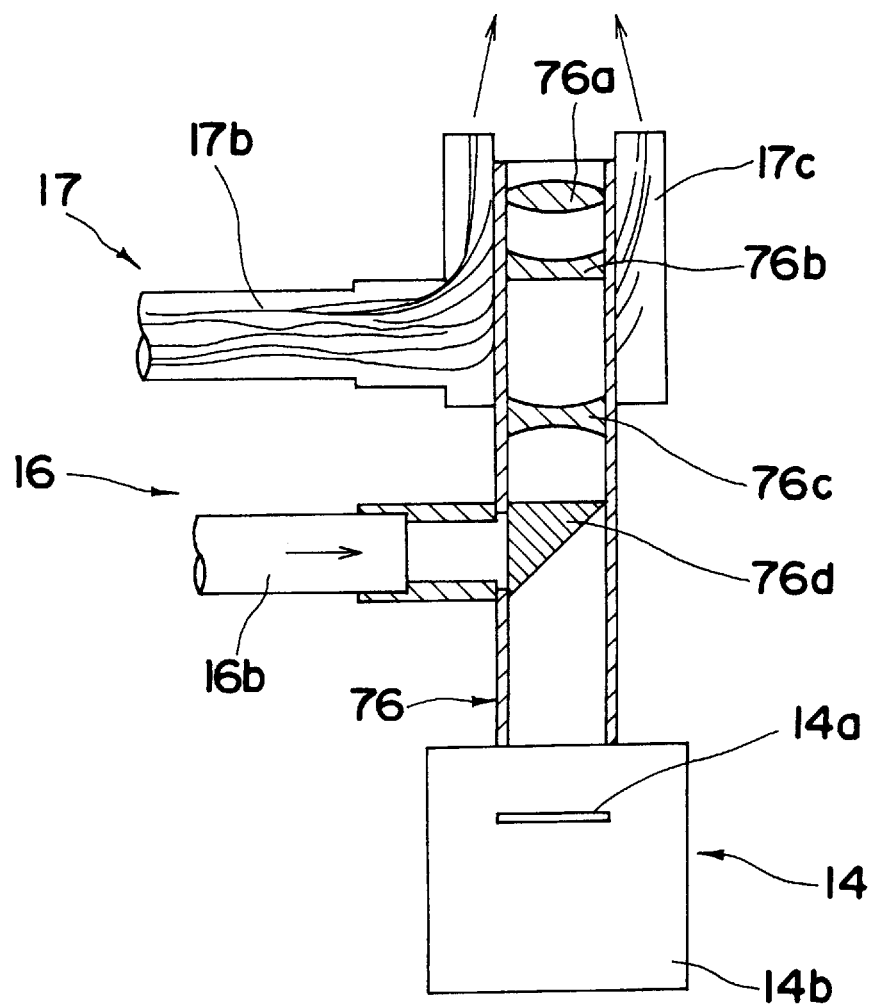
FIG. 3B is a side view, partly in section, of part of the illuminating means of FIG. 3A.

The illuminating means 15 is so constituted as to provide coaxial illumination for casting a coaxial light and ring illumination for casting a scattered light. As is clear from FIG. 3A, the illuminating means 15 is provided with a coaxial illumination means 16 for casting an illumination light coaxially to an optical axis of the image recognizing means 14 and a ring illumination means 17 for casting an illumination light from the periphery of the image recognizing means 14. A shutter 18 disposed in the middle of each of light guide fibers 16b, 17b connecting the illuminating means 16, 17 with light sources 16a, 17a shuts or opens each optical path. The two shutters 18 are operable independently of each other. A halogen illumination may be used as the illuminating means 16 and 17. In FIG. 3B, a cylindrical member 76 projects from a case 14b of a CCD camera 14a along an optical axis of the CCD camera 14a which serves as the image recognizing means. The light guide fibers 16b and 17b are connected to the upper and lower parts of the cylindrical member 76, respectively. The light guided from the light source 16a through the fiber 16b is refracted 90° by a half mirror 76d in the lower part inside the cylindrical member 76, advancing along the axis of the cylindrical member 76 through three lenses 76c, 76b, and 76a. Accordingly, the light as a coaxial light illuminates the marks. Meanwhile, the light from the light source 17a guided through the fiber 17b is refracted 90° by a cylindrical guide 17c fixed in the outer circumference of the upper part of the cylindrical member 76 and proceeds along the axis of the cylindrical member 76. As a result, the light as a ring-shaped scattered light illuminates the marks. On the other hand, images of the mounting position marks and the positioning marks illuminated and reflected by the above illuminating means through the three lenses 76a, 76b, and 76c and half mirror 76d along the optical axis of the cylindrical member 76 are taken by the CCD camera 14a of the image recognizing means 14, so that the positional shift of the mounting position marks and the positioning marks is detected by a controlling means 70 to be described later.

An auxiliary image recognizing means 19 is installed between the feeding means 5 and the stage 4. A ring illumination means 20 arranged in the periphery of the recognizing means 19 recognizes a suction position of the electronic component 1 in the middle of the transfer of the component 1 by the mounting head 7. These auxiliary image recognizing means 19 and ring illumination means 20 are constructed generally in the same structure as the above image recognizing means 14 and ring illumination means 17, respectively.

Figure 4:
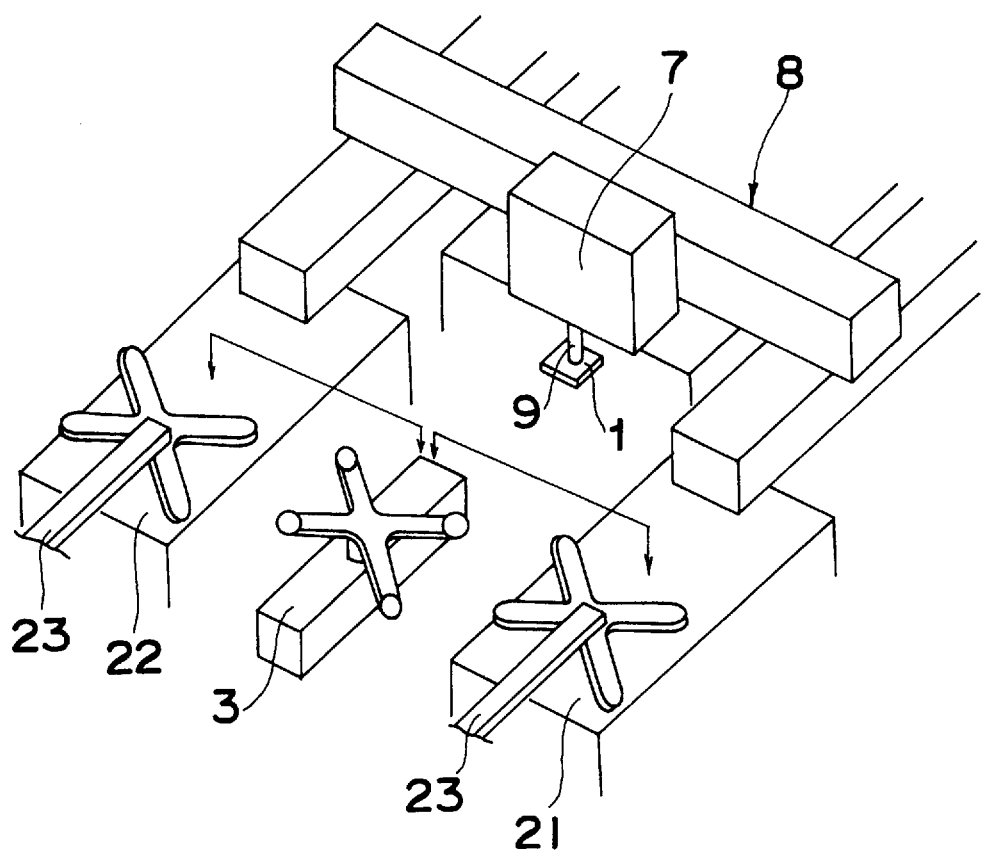
FIG. 4 is a perspective view of the whole schematic structure of the first embodiment.
Figure 5:
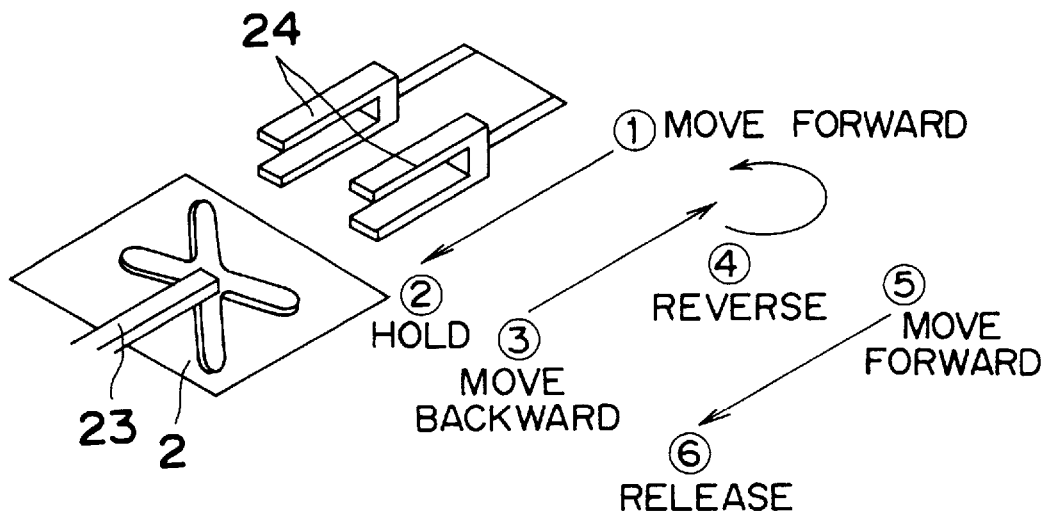
FIG. 5 is a diagram schematically describing the operation of a reversing means of the first embodiment.
Figure 15:
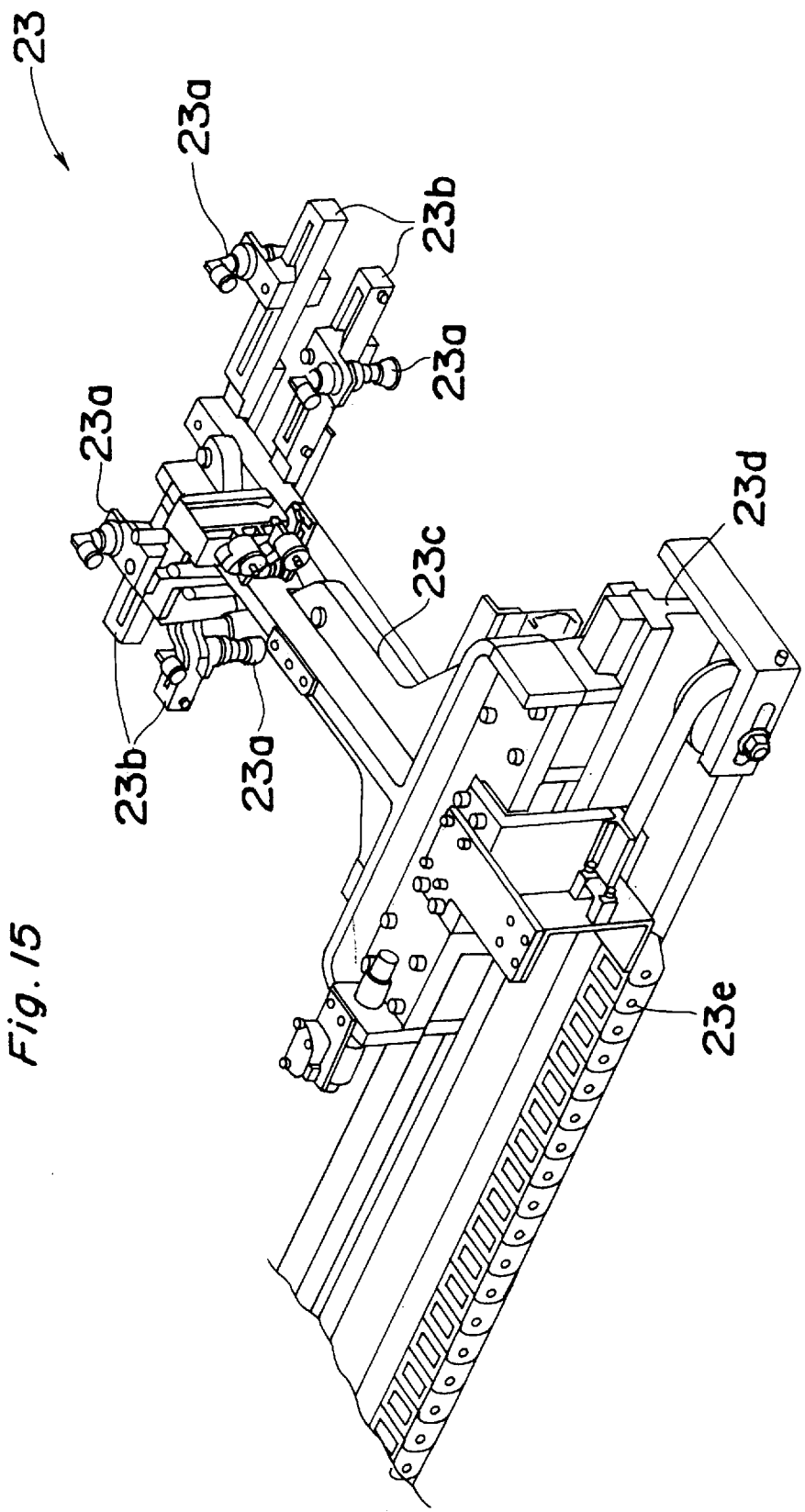
FIG. 15 is an enlarged perspective view of a transferring means in FIG. 14.
Figure 16:
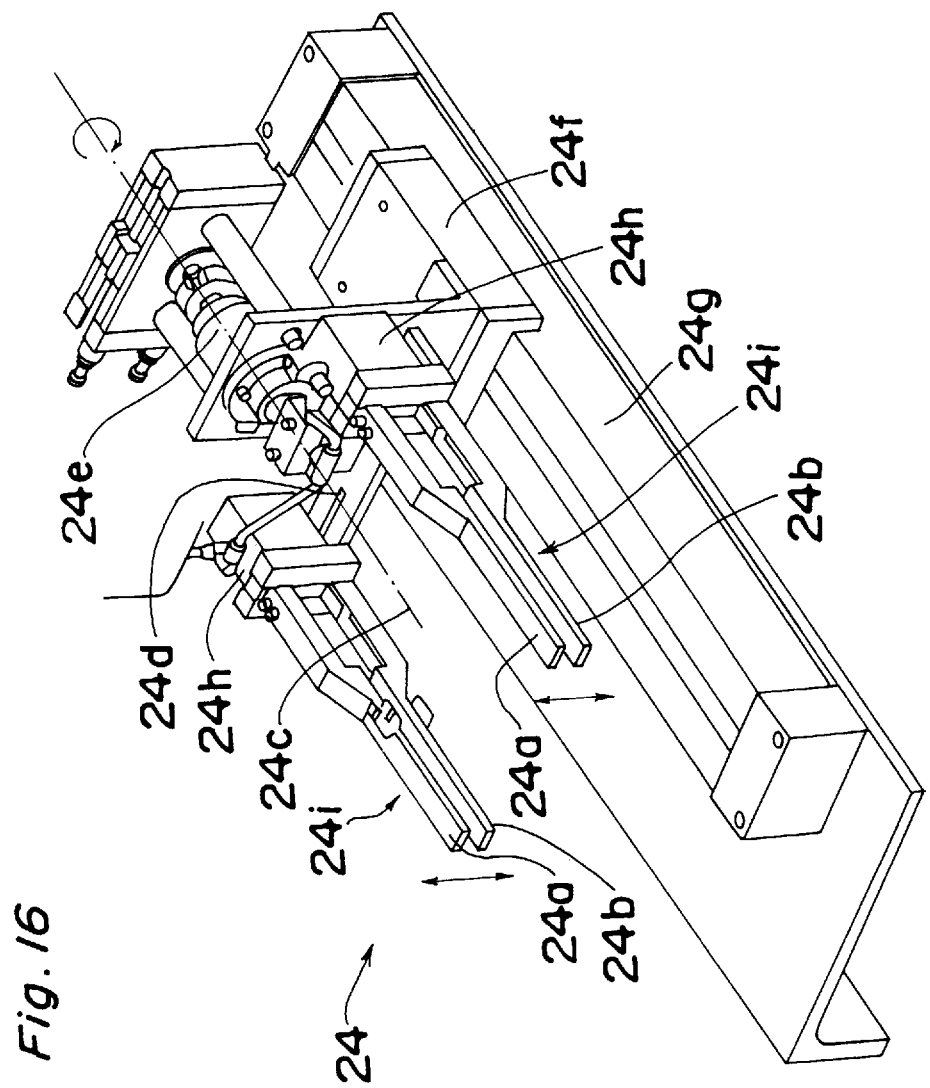
FIG. 16 is an enlarged perspective view of a catching means in FIG. 14.

Further, the electronic component mounting apparatus of the first embodiment is, as shown in FIGS. 4 and 14, provided with glass panel reversing means 21, 22 at both sides of the holding means 3. Also transferring means 23 are provided for transferring the glass panels 2 simultaneously in the same direction between the reversing means 21 and holding means 3 and between the holding means 3 and the reversing means 22. The reversing means 21, 22 and transferring means 23 are illustrated in a simplified manner in FIGS. 4 and 5 for the convenience of understanding. As shown in FIGS. 5, 15, and 16, in the reversing means 21 and 22, a catching means 24 is moved forward and grasps the glass panel 2 at both lateral sides, and then is retracted and reverses the glass panel 2, and is moved again forward and releases the glass panel 2 at a delivery position to the transferring means 23. Therefore, for example, when the electronic component 1 is mounted by the mounting head 7 to the glass panel 2 held by the holding means 3, a different glass panel 2 can be reversed, etc., that is, controlled in posture by the reversing means 21 and one transferring means 23, while on the other hand, another different glass panel 2 can be controlled in posture by the reversing means 22 and the other transferring means 23.

The catching means 24 constituting each of the above reversing means 21, 22 is constructed in the following manner as shown in FIG. 16. The catching means 24 has a pair of holding arms 24i. Each holding arm 24i generally consists of upper and lower holding parts 24a and 24b and a driving cylinder 24h which drives the upper and lower holding parts 24a and 24b to be in touch and out of touch with each other. When two driving cylinders 24h of the pair of holding arms 24i are driven synchronously, the upper and lower holding parts 24a and 24b of each holding arm 24i grasp the glass panel 2 or release the glass panel 2. The pair of the holding arms 24i is coupled by a coupling-and-supporting plate 24d which is rotatable 360° about a rotary axis 24c when a driving motor 24e is driven for rotation. A pedestal 24f of the driving motor 24e coupled to the supporting plate 24d supporting the pair of the holding arms 24i can be moved linearly (along the X direction in FIG. 14) by a linear motion mechanism 24g. The linear motion mechanism 24g is generally equal to one, for instance, constituted of the driving motor 12, guide rail 11, and feed screw mechanism 13, etc. of FIG. 12.

As shown in FIG. 15, the transferring means 23 has the following constitution. The transferring means 23 comprises four suction members 23a, four arms 23b able to adjust the intervals of the four suction members 23a in the Y direction, a supporting member 23c for supporting the four suction members 23a and four arms 23b which can adjust the intervals of the arms 23b in the X direction, a guide rail 23d for moving and guiding the supporting member 23c in the Y direction, and a driving motor 23f for driving the supporting member 23c along the guide rail 23d in the Y direction via a chain 23e. In the constitution, for example, the glass panel 2 standing by at a mounting waiting position is sucked by the four suction members 23a and supplied onto the holding means 3 by the drive of the driving motor 23f for rotation, or the glass panel 2 held by the holding means 3 is sucked again by the suction members 23a and removed from the holding means 3 to correct the position, or the glass panel 2 is sucked by the suction members 23a and removed from the holding means 3 and transferred to the catching means 24 to be reversed by the reversing means 21, 22.

Figure 37:
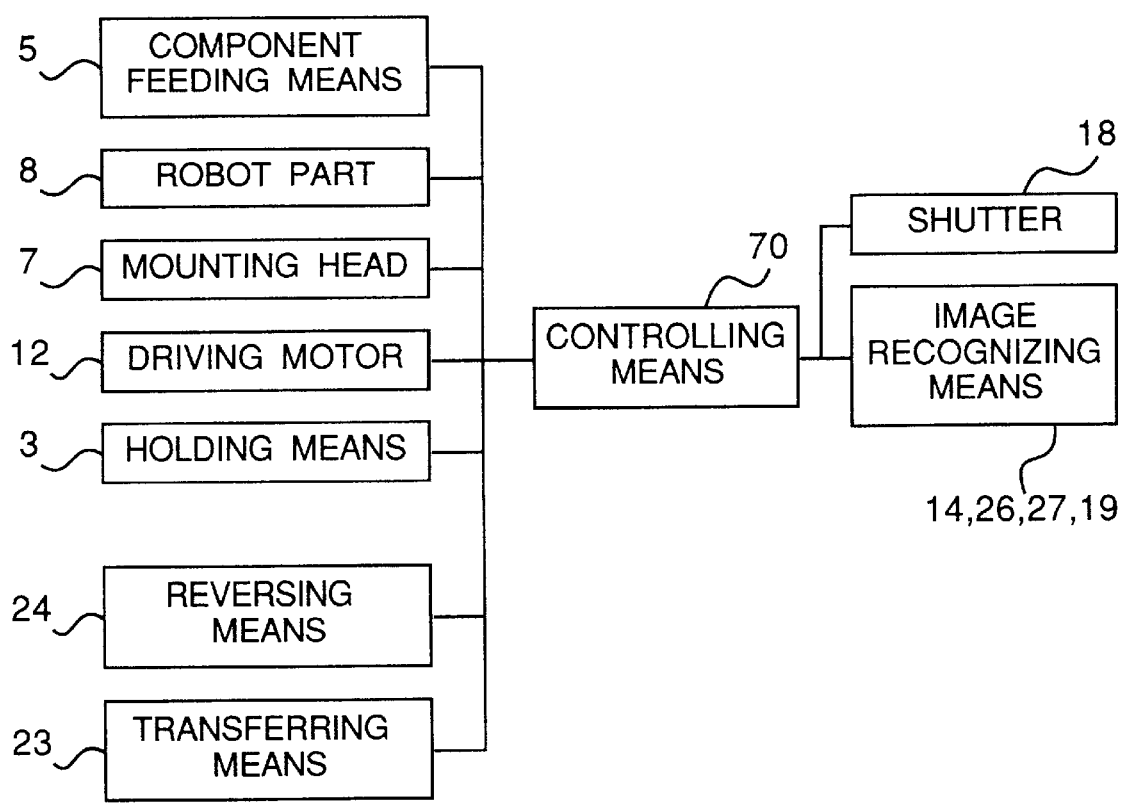
FIG. 37 is a block diagram of the relationship of the electric connection between a controlling means and other means of the electronic component mounting apparatus in the first embodiment.

Referring now to FIG. 37, the controlling means 70 is electrically connected to the feeding means 5, robot part 8, mounting head 7, driving motor 12, holding means 3, catching means 24 of the reversing means 21 and 22, transferring means 23, shutter 18, image recognizing means 14 and 19, and image recognizing means 26 and 27 which will be described later. That is, the controlling means 70 controls the whole operation of the apparatus so that the catching means 24 can hold and release the glass panel 2, moves forward and backward in the X direction and reverses the glass panel 2, and the driving motor 23e of the transferring means 23 can be driven, or the suction members 23a suck and detach the glass panel 2, as well as the moving and adjusting action of the arms 23b of the suction members 23a.

Moreover, the controlling means 70 appropriately controls the operation when the holding means 3 holds and releases the glass panel 2, when the mounting head 7 moves in the X, Y, Z directions, sucks or releases the electronic component 1, and when the feeding means 5 feeds the electronic component 1. The controlling means 70 further acts to recognize images of the positioning marks 1e of the electronic component 1 and the mounting position marks 2b of the glass panel 2 and detect the positional shift of the images. The position of the glass panel 2 held by the holding means 3 is suitably changeable depending on the result of the above recognition by the controlling means 70.

The holding means 3 is positionally adjusted in the X direction as a supporting member 3c is moved back and forth by the feed screw mechanism 3b subsequent to the rotation of the driving motor 3a in the forward and backward directions. At the same time, the holding means 3 is movable between the mounting position and the position mark recognizing position which are closest to the feeding means 5 in the X direction, and a glass panel discharging position which is farthest from the feeding means 5. The glass panel 2 is delivered between the holding means 3 and transferring means 23 at the discharging position.

Now, a process to mount the electronic component 1 to a lateral side of the glass panel 2 will be described with reference to FIGS. 7 and 8 and a flow chart of FIG. 9.

Figure 9:
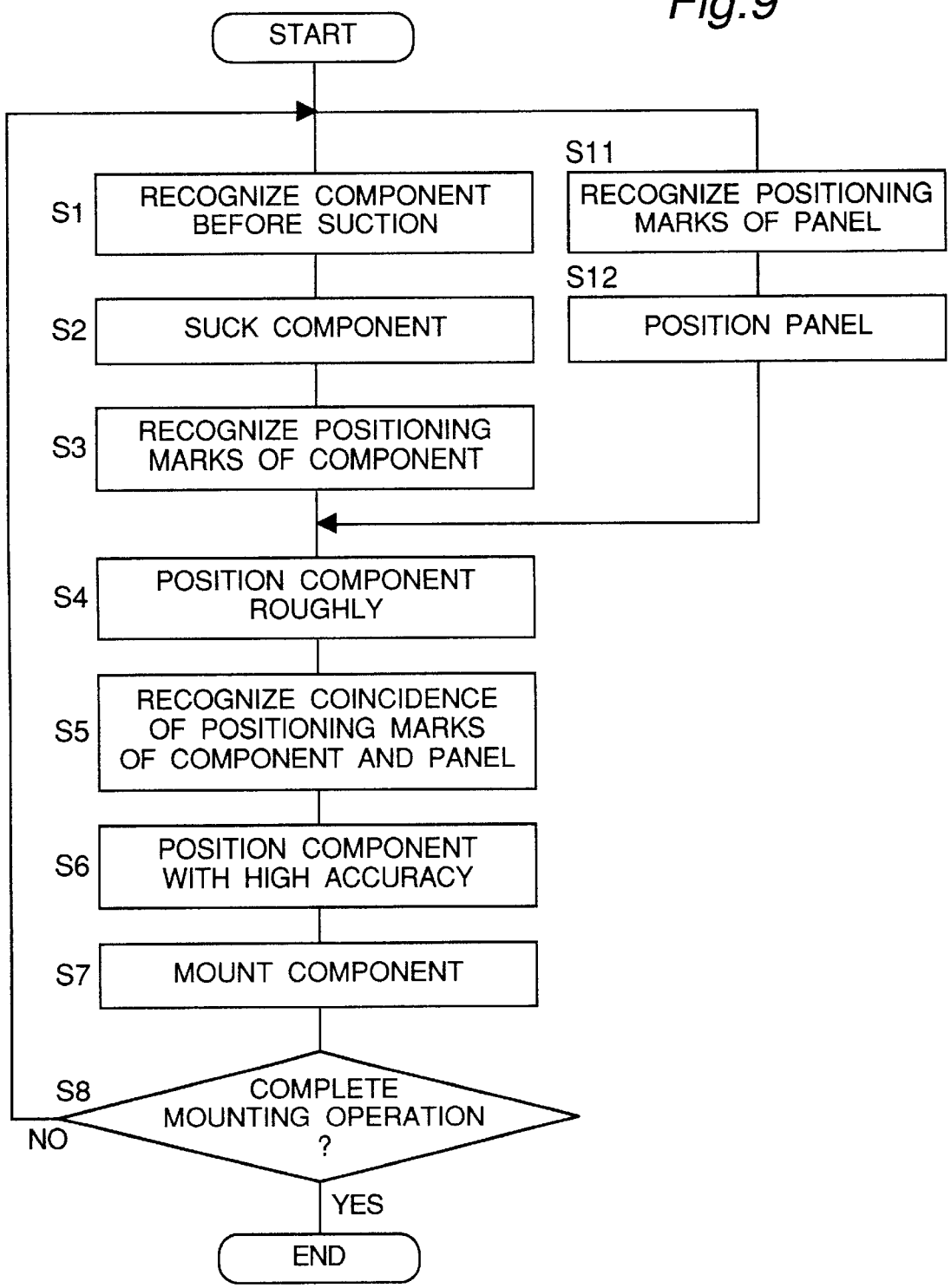
FIG. 9 is a flow chart of a mounting operation in the first embodiment.

In the case where a new glass panel 2 is fed, and also in the case where a to-be-mounted lateral side of the glass panel 2 is switched, the positioning marks 2b shown at both ends of the lateral side of the glass panel 2 are respectively recognized by the image recognizing means 14 (step S11 in FIG. 9). For this purpose, the image recognizing means 14 is stopped by the driving motor 12 at each position to recognize the corresponding mark.

On the basis of the result of the recognition, an error between the current position of the lateral side of the glass panel 2 where the component 1 is to be mounted and a predetermined position where the lateral side is to be positioned is calculated by the controlling means 70. The holding means 3 holding the glass panel 2 is positioned based on the calculation (step S12 in FIG. 9). Positioning at this time is executed by transferring the glass panel 2 between the transferring means 23 and holding means 3.

While the glass panel 2 is positioned in the above-described fashion, concurrently, the mounting head 7 is moved over the feeding position 6 of the feeding means 5 and, the position of the electronic component 1 to be sucked is recognized by a recognizing camera 80 of the mounting head 7 (referring to FIG. 14) if necessary (step S1 in FIG. 9). The electronic component 1 is sucked by the mounting head 7 (step S2 in FIG. 9). The sucked electronic component 1 is sent to the auxiliary image recognizing means 19, where the two positioning marks 1e of the electronic component 1 are recognized, so that the position of the sucked electronic component 1 is recognized (step S3 in FIG. 9). Thereafter, the electronic component 1 is roughly positioned at a required mounting position on the glass panel 2 previously positioned on the holding means 3 based on the recognized position of the component 1 (step S4 in FIG. 9).

Figure 7:
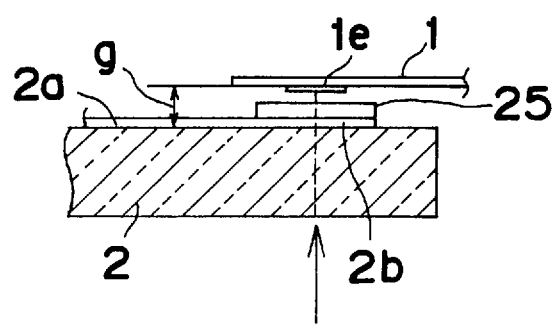
FIG. 7 is a sectional view explanatory of a state where a mounting position mark and a positioning mark are recognized in the first embodiment.
Figure 8:
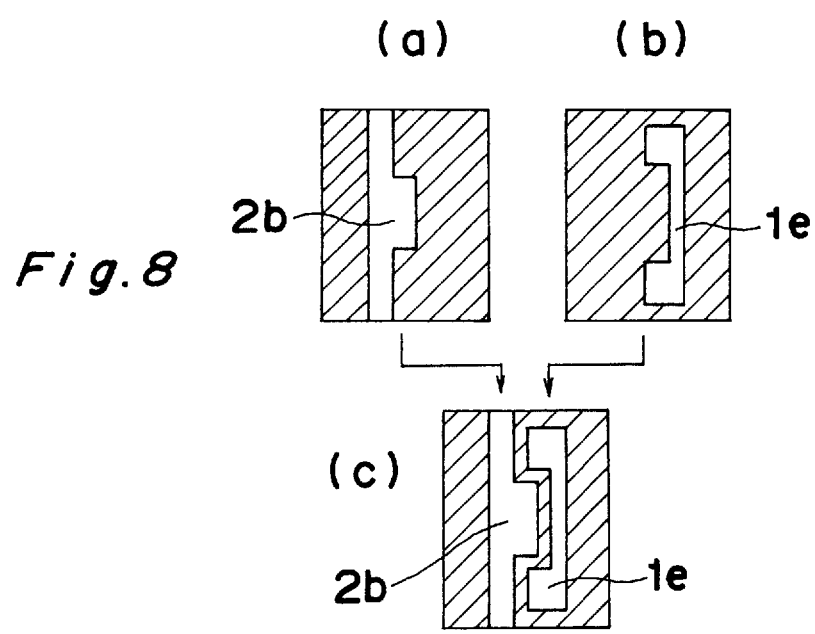
FIG. 8 is a diagram explanatory of the positional recognition in the first embodiment.

As indicated in FIGS. 7 and 8, a transparent electrode film 2a of copper, gold, or silver is formed on the glass panel 2. The transparent electrode film 2a forms the generally T-shaped mounting position marks 2b as shown by a reference symbol (a) in FIG. 8. Each mounting position mark 2b in configuration corresponds to each generally C-shaped positioning mark 1e of the electronic component 1 shown by a reference symbol (b) in FIG. 8. Since the mounting position mark 2b is formed of the transparent electrode film 2, the mark 2b regularly reflects the light entering perpendicularly to the surface of the film 2a, but passes the light from other directions. If the coaxial illumination means 16 is used, the light enters at right angles to the surface of the transparent electrode film 2 and therefore the light is reflected by the mounting position mark 2b, whereby the mounting position mark 2b is recognized by the image recognizing means 14. In this case, the light from the coaxial illumination means 16 is almost totally reflected at the mounting position mark 2b, and therefore, the light does not reach the positioning mark 1e of the electronic component 1 which is above the mounting position mark 2b, and the positioning mark 1e is not recognizable by the image recognizing means 14. In contrast, when the ring illumination means 17 is used, the light enters not perpendicularly to the surface of the electrode film 2a and penetrates the transparent electrode film 2b without being reflected by the mounting position mark 2b. As a result, the mounting position mark 2b is not recognized as is obviously understood from the symbol (b) of FIG. 8, whereas the positioning mark 1e of the electrode component 1 is recognized by the penetrating light by the image recognizing means 14. In order to recognize the mounting position marks 2b and the positioning marks 1e by the coaxial illumination means 16 and ring illumination means 17, the marks 2b, 1e are not simultaneously illuminated by both illumination means 16, 17, but the shutter 18 of either illumination means is opened with the shutter 18 of the other illumination means being closed. This is better to enhance the recognizing accuracy. An ACF (anisotropic conductive film) 25 is adhered onto the transparent electrode film 2a.

The mounting position marks 2b and positioning marks 1e may be formed in other different shapes. For example, one is a circular mark and the other is a ring in which the circular mark is fitted at the center thereof via a predetermined gap, as in FIG. 13A. According to a modified example of FIG. 13B, one is square and the other is a square frame in which the square is fitted at the center thereof via a predetermined space. In a modification shown in FIG. 13C, one is a cross and the other is formed of four L-shaped parts separated a predetermined distance each other, and the cross is fitted at the center of the L-shaped parts. The minimum number of the mounting position marks 2 and positioning marks 1e is each 2 so as to position the side at a predetermined position.

While the electronic component 1 is roughly positioned with a gap (g), approximately 0.05–0.1 mm above the upper surface of the glass panel 2 as shown in FIGS. 7 and 3, an illuminating light is cast from the coaxial illumination means 16 to thereby recognize the electronic component 1 by the image recognizing means 14, and thereafter, the shutter 18 is switched and an illuminating light from the ring illumination means 17 is cast to recognize the electronic component 1 by the image recognizing means 14. In this manner, the mounting position marks 2b and positioning marks 1e are recognized as the symbols (a) and (b) in FIG. 8 (step S5 in FIG. 9). The relative position of the marks 2b and 1e is recognized by combining the recognized images on an image memory, as shown by a reference symbol (c) in FIG. 8. Then, the mounting head 7 is adjusted finely to attain the proper relative position based on the result. The electronic component 1 is thus corrected and positioned at the right position with high accuracy (step S6 in FIG. 9).

After the electronic component 1 is positioned highly accurately as above, the tool 9 is descended to press the electronic component 1 to the glass panel 2 via the ACF 25. The electronic component 1 is hence mounted to the glass panel 2 (step S7 in FIG. 9). The above-described procedure is repeated until every required side of the glass panel 2 is completely processed (step S8 in FIG. 9).

When mounting of the electronic component 1 to the required side of the glass panel 2 is completed, the other lateral side of the glass panel 2 is positioned by the holding means 3 to a predetermined position on the stage 4 to repeat the above procedure. The reversing means 21 or 22 of FIGS. 4 and 5 is employed when the glass panel 2 is to be reversed. At this time, the glass panel 2 is delivered between the reversing means 21 and holding means 3 or between the holding means 3 and reversing means 22. This enables the reversal of a different glass panel 2 having the electronic components already mounted on one surface thereof simultaneously when the subject glass panel 2 is being processed. In other words, the working efficiency of the mounting apparatus is improved and the productivity is enhanced.

As is described hereinabove, according to the first embodiment of the present invention, the relative position of the mounting position marks 2b set at the mounting position of the glass panel 2 and the positioning marks 1e of the electronic component 1 is recognized while the marks 2b and 1e are overlapped, and then based on the recognized result, the position of the electronic component 1 is corrected. The electronic component 1 is accordingly quite accurately mounted to the glass panel 2. Moreover, since it is enough to recognize the relative position once from the opposite surface to the mounting surface of the glass panel 2, the tact time in the mounting operation is advantageously kept short.

In the case where the electronic component 1 is to be mounted on the glass panel 2 constituting the liquid crystal panel which has the mounting position marks 2b formed of the transparent electrode film 2a and the ACF 25 adhered on the electrode film 2a, the mounting position marks 2b and positioning marks 1e are individually recognizable simply by switching the coaxial illumination means 16 and ring illumination means 17 by means of the shutters 18. The electronic component 1 is positioned and mounted highly accurately to the glass panel 2 after the recognized marks 2b and 1e are overlapped and registered with each other. In addition, even when the mounting position marks 2b are formed of the transparent electrode film 2a on the glass panel 2, the mounting position marks 2b and the positioning marks 1e are surely recognized by appropriately switching the illumination means 16 and 17 by the shutters 18.

Since the moving body 10 is equipped with the image recognizing means 14, coaxial illumination means 16, and ring illumination means 17, it is possible to recognize the position of each electronic component 1 on the glass panel 2 and mount the electronic component 1 to the glass panel 2 while the glass panel 2 is supported in the fixed state. The moving mechanism of the moving body 10 is simple enough to be a linear motion mechanism. The electronic component 1 is mounted with high accuracy in the compact and inexpensive structure.

The auxiliary image recognizing means 19 recognizes the suction position of the electronic component 1. If the electronic component 1 is roughly positioned at the mounting position based on the above suction position, the mounting position marks 2b can be registered with the positioning marks 1e surely in one step of operation. Therefore, the time necessary for recognition is eventually shortened in some cases although the recognizing number of times is increased.

In the first embodiment, the reversing means 21 and 22 are arranged at both sides of the holding means 3 for the glass panel 2 which is an example of a transparent panel, so that the glass panel 2 is delivered between the holding means 3 and the reversing means 21, 22. Owing to this arrangement, while one glass panel 2 is being processed, another glass panel 2 having the electronic components already mounted on one surface thereof may be reversed by either reversing means 21, 22. The working efficiency of the apparatus is improved and the productivity is enhanced.

Figure 10A:
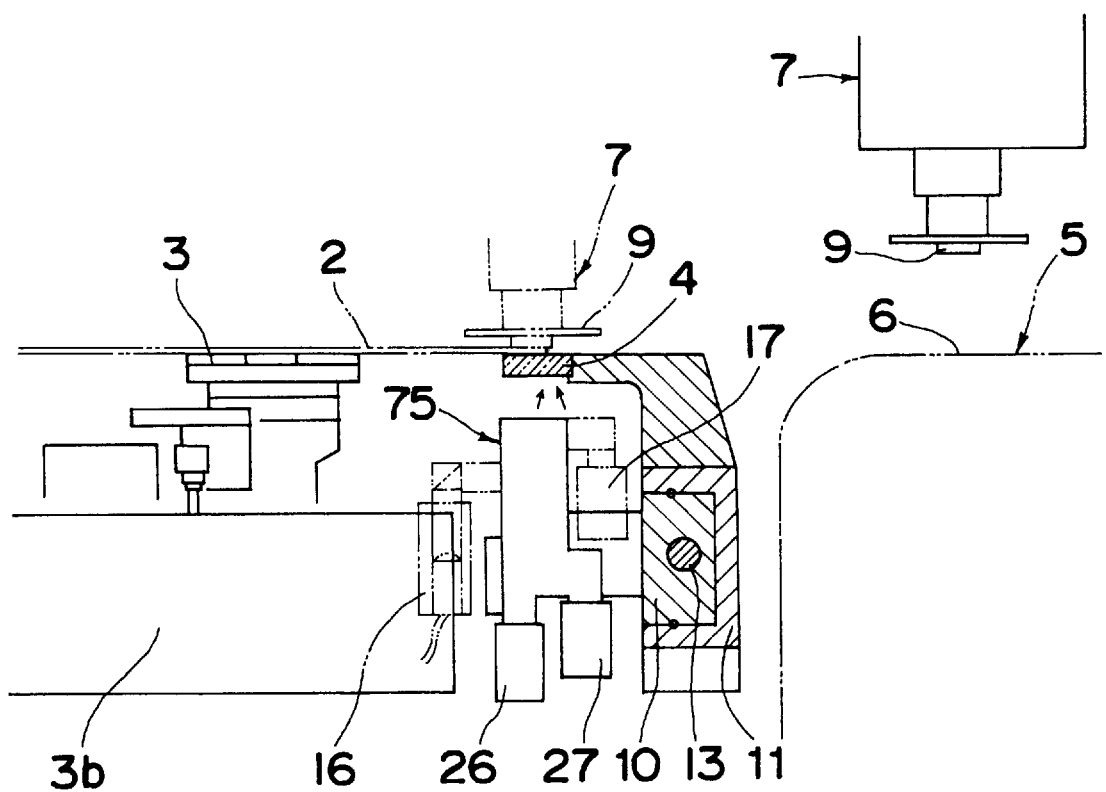
FIG. 10A is a schematic structural diagram of part of an electronic component mounting apparatus in a second embodiment of the present invention.
Figure 17:
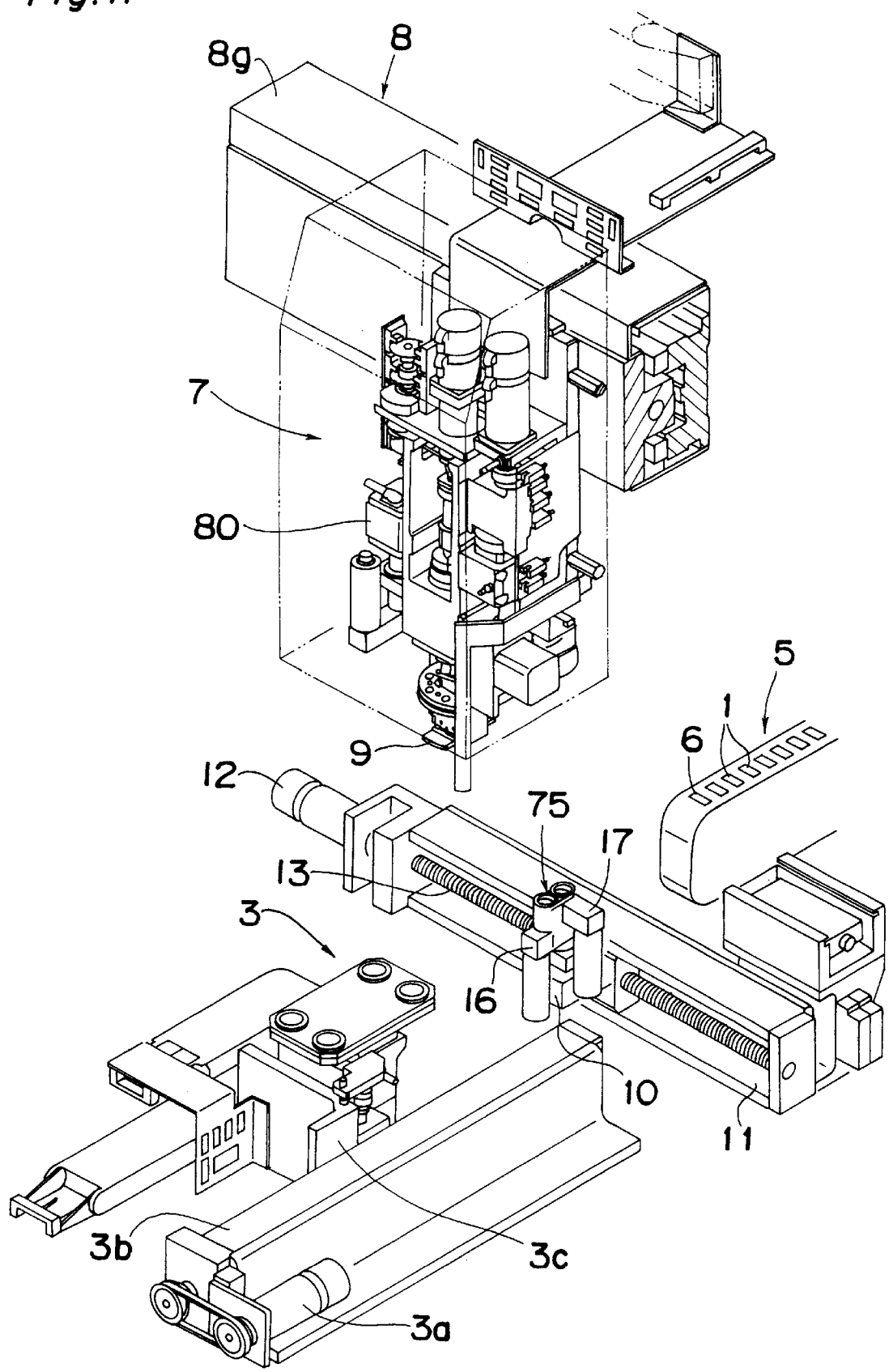
FIG. 17 is a perspective view, partly in section, of part of the electronic component mounting apparatus of FIG. 10A.

An electronic component mounting apparatus in a second embodiment of the present invention will be discussed with reference to FIGS. 10A, 10B, and 17. The same constitutional parts or elements as those in the first embodiment will be omitted from the description below, and only points that are different be described. That is, according to the second embodiment of the present invention, marks illuminated by two illuminating means are not recognized by one image recognizing means, instead the marks illuminated by each illuminating means are recognized by a respective image recognizing means. More specifically, the moving body 10 has a first image recognizing means 26 and the coaxial illumination means 16 immediately below the mounting position of the glass panel 2, and moreover a second image recognizing means 27 and the ring illumination means 17 in the vicinity of the first image recognizing means 26. The illuminating means 26 and 27 are not illustrated in FIG. 17 for the sake of brevity.

Figure 10B:
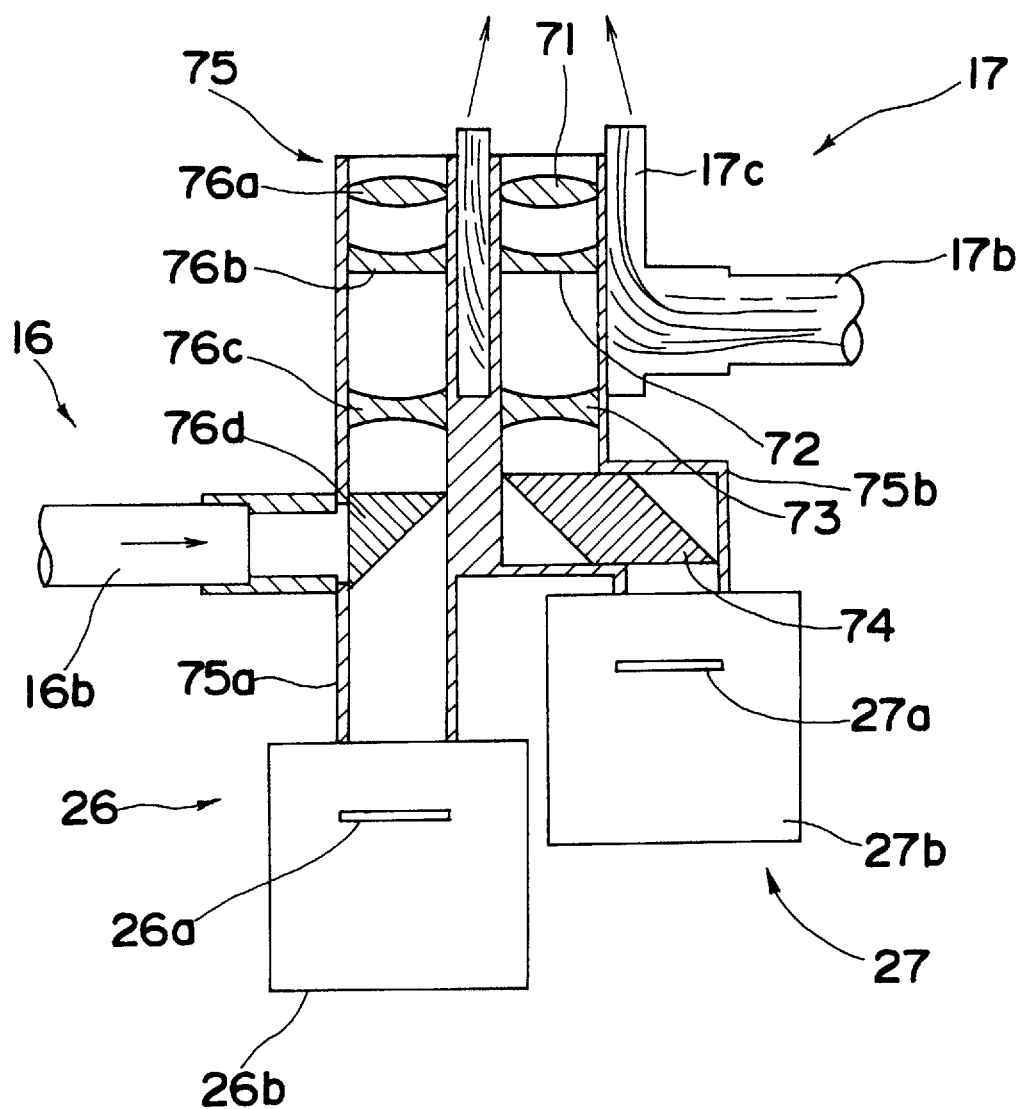
FIG. 10B is a side view, partly in section, of part of an illuminating means in FIG. 10A.

In FIG. 10B, a generally hollow member 75 is projected from a case 26b of a CCD camera 26a as the first image recognizing means 26, which has a cylindrical part 75a extending parallel to an optical axis of the CCD camera 26a. The light guide fiber 16b is connected to the lower part of the hollow member 75. The light from the light source 16a through the light guide fiber 16b is refracted 90° by a half mirror 76d in the lower part in the cylindrical part 75a of the hollow member 75, sent in the axial direction of the cylindrical part 75a through three lenses 76c, 76b, and 76a, thereby illuminating, as a coaxial light, the marks. The above first image recognizing means 26 takes only images of the mounting position marks illuminated and reflected by the illumination means 16 through the three lenses 76a, 76b, and 76c and half mirror 76d, into the CCD camera 26a. The hollow member 75 has a bent hollow part 75b which extends from a case 27b of the second image recognizing means 27. The light introduced from the light source 17a through the light guide fiber 17b connected to the upper part of the hollow part 75b is refracted 90° by a cylindrical guide 17c secured in the outer upper periphery of the hollow member 75, running along the axial direction of the hollow member 75, to illuminate the marks as a ring-shaped scattered light.

The second image recognizing means 27 takes only images of the positioning marks through three lenses 71, 72, and 73 and a prism mirror 74 along an optical axis of the bent hollow part 75b into a CCD camera 27a. Data recognized by the first and second image recognizing means 26 and 27 is sent to the controlling means 70, where two images of the mounting position mark and positioning mark are overlapped and registered with each other, similar to the foregoing first embodiment. The position correcting operation is performed based on the calculation in the controlling means 70.

In the second embodiment, in the middle of the transfer of the mounting head 7 holding the electronic component 1 by the tool 9 from the feeding position 6 to the mounting position, not only are the positioning marks 1e of the electronic component 1 recognized by the second image recognizing means 27 in the vicinity of the mounting position, but the mounting position marks 2b of the glass panel 2 are recognized by the first image recognizing means 26 at the mounting position. The mounting head 7 is moved and positioned at the mounting position while corrected based on the recognized position, and then carries out the component mounting operation. In this case, since the moving distance of the mounting head 7 after the positioning marks 1e of the electronic component 1 are recognized is so small as to hardly generate a moving error, the mounting head 7 accomplishes highly accurate mounting, similar to the first embodiment.

The electronic component mounting apparatus of the second embodiment is provided with the first image recognizing means 26 and coaxial light casting means 16 which can be positioned immediately below the mounting position on the transparent panel and the second image recognizing means 27 and scattered light casting means 17 in the vicinity of the first image recognizing means 26, in addition to the feeding means 5, holding means 3 for holding the transparent panel (glass panel), and mounting head 7. Because of the above constitution in the second embodiment, after both the positioning marks 1e of the electronic component 1 are recognized by the second image recognizing means 27 in the vicinity of the mounting position and the mounting position marks 2b of the glass panel 2 are recognized by the first image recognizing means 26 at the mounting position, the mounting head 7 is moved such a small distance as to hardly generate a moving error while the positional error is being corrected, and then positioned. Accordingly, the second embodiment realizes highly accurate mounting similar to the first embodiment.

In the second embodiment as well, the first and second image recognizing means 26 and 27, and coaxial light casting means 16 and scattered light casting means 17 are set in the moving body 10, allowing the transparent panel to be kept fixed. A simple linear motion mechanism is sufficient for the moving mechanism of the moving body 10. Accordingly, highly accurate mounting is achieved in the compact and inexpensive constitution.

Figure 11:
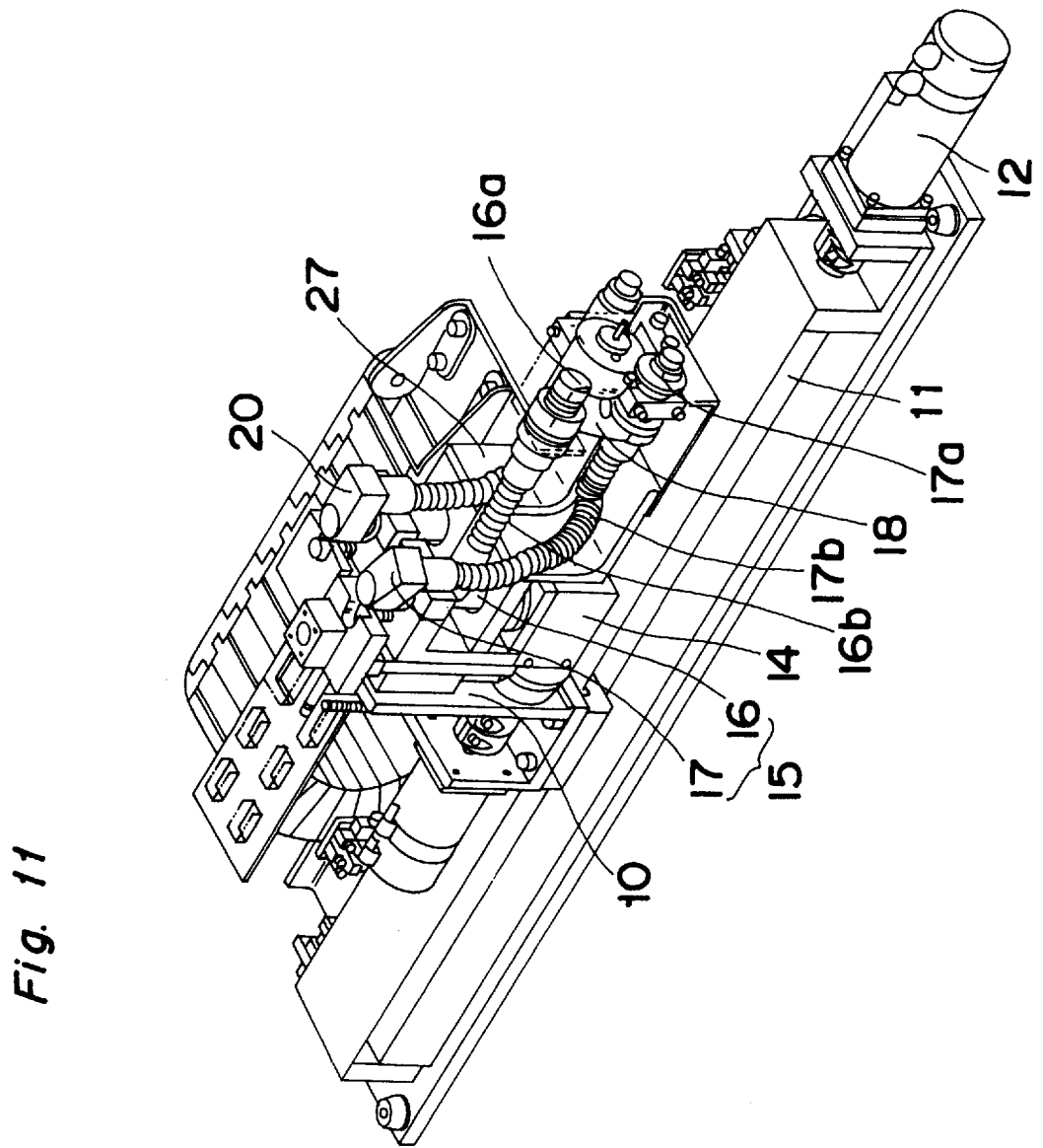
FIG. 11 is a perspective view of a recognizing means in a third embodiment of the present invention.
Figure 18:
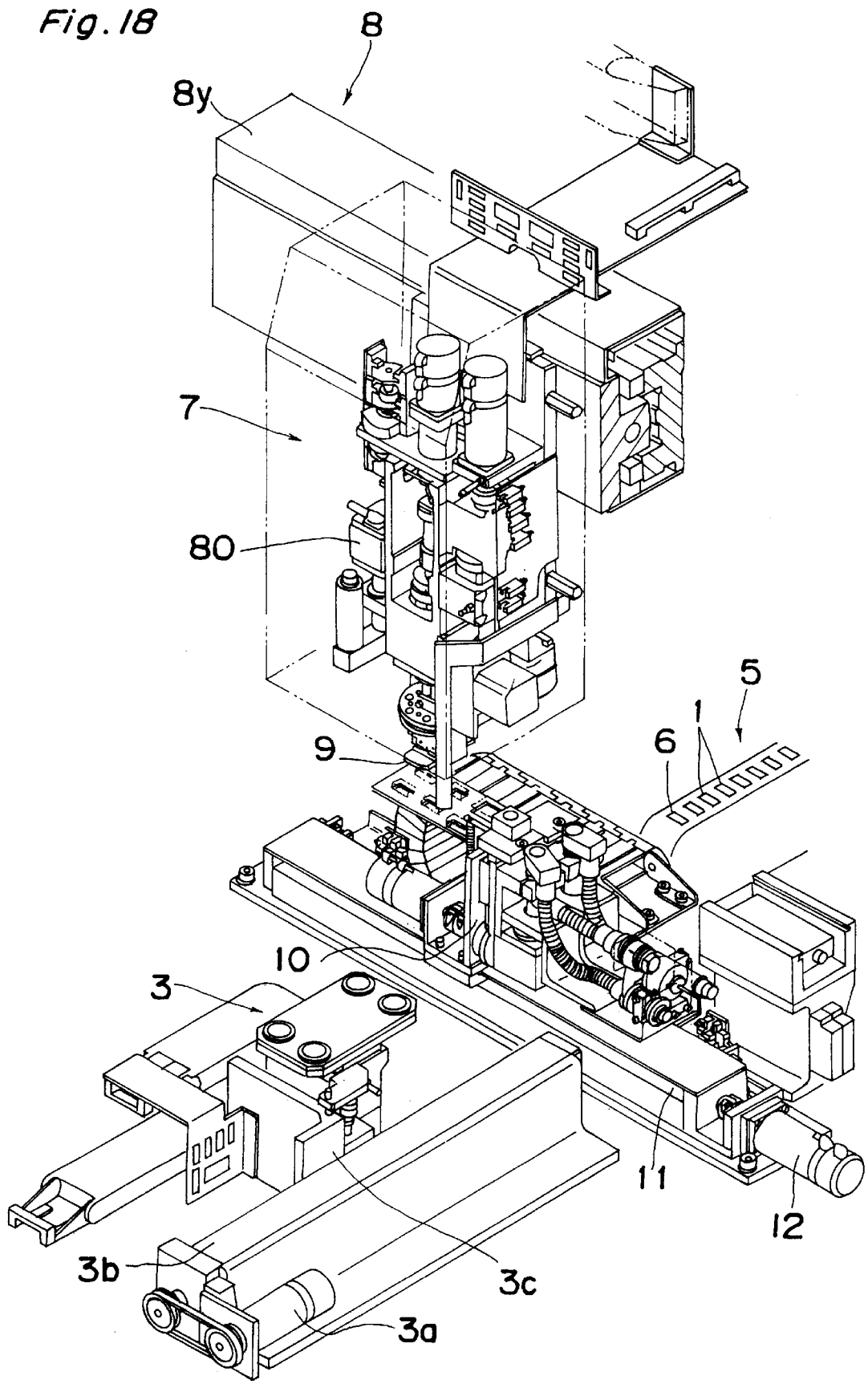
FIG. 18 is a perspective view, partly in section, of part of the electronic component mounting apparatus of FIG. 11.

An electronic component mounting apparatus according to a third embodiment of the present invention will be described with reference to FIGS. 11 and 18. According to the third embodiment, the image recognizing means 14 and the illuminating means 15 capable of casting selectively a coaxial light and a scattered light, both used in the first embodiment, are employed, in place of the first image recognizing means 26 and coaxial light casting means 16 of the second embodiment. The electronic component mounting apparatus of the third embodiment is convertible to the apparatus of the first embodiment when only the aforementioned image recognizing means 14 and illuminating means 15 for selective illumination are used, or to the apparatus of the second embodiment only with the second image recognizing means 27 and ring illumination means 17 and the first image recognizing means 14 and illuminating means 16.

The third embodiment selectively functions as the mounting apparatuses of the first and second embodiments depending on conditions.

A concrete example of the holding means 3 in a fourth embodiment of the apparatus will be explained with reference to FIGS. 19–21 and 22A–22D.

The holding means 3 has a panel placing plate 31a. Flat circular suction pads 33 are arranged in the vicinity of four corners of a panel placing surface 32 which is an upper surface of the panel plate 31a. A suction port 34 connected to a vacuum source 900 is formed at the center of the upper surface of each suction pad 33, with four grooves 35 radially notched from the suction port 34 to describe a cross. The width of the radial groove 35 is preferably not larger than 8 times, more preferably 3–5 times the thickness of the glass panel 2 to be held by suction. The length of the groove 35 is determined by a value obtained by dividing the area of an upper opening of the groove 35 necessary to securely hold the glass panel 2 by the width of the groove 35.

Figure 21A:
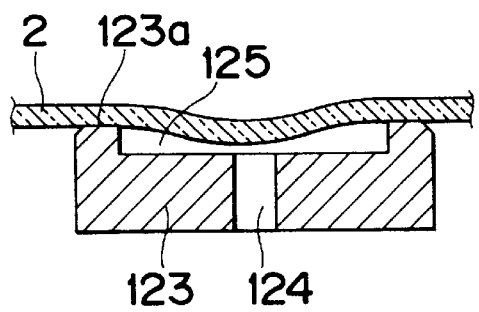
FIGS. 21A and 21B are sectional views of a suction state when the panel is suctioned in a conventional example and the fourth embodiment of the present invention, respectively.
Figure 21B:
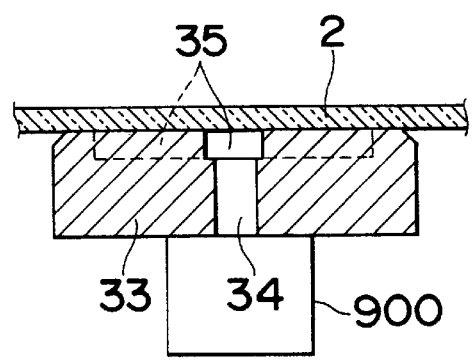

In the constitution according to the fourth embodiment, when the glass panel 2 placed on the panel placing surface 32 of the holding means 3 is sucked via the suction ports 34 of the radial grooves 35 which is connected to the vacuum source 900, the upper openings of the four radial grooves 35 are shut by the placed glass panel 2, thus forming compressed spaces, so that the glass panel 2 is sucked and securely held by the suction pads 33. Since the radial grooves 35 formed on the upper surface of each suction pad 33 are smaller in width as shown in FIG. 21B than a circular or square recess exemplified in FIG. 21A, the short distance of edges of the upper opening of each groove restricts bending stress and distortion even if the suction forces exert bending loads to portions of the glass panel 2 facing the upper openings. Therefore, the quality failure as a result of the deformation of the glass panel 2 is eliminated.

Since the contact face between each suction pad 33 and glass panel 2 is formed wide in area in the periphery of the radial grooves 35, a large friction force surely works to positively hold the glass panel 2 so as not to be shifted. Furthermore, the radial configuration of the grooves 35 from the center of the suction pad 33 creates a friction force effectively in every direction against the positional shift of the glass panel 2 to effectively prevent the positional shift of the glass panel 2.

Figure 19:
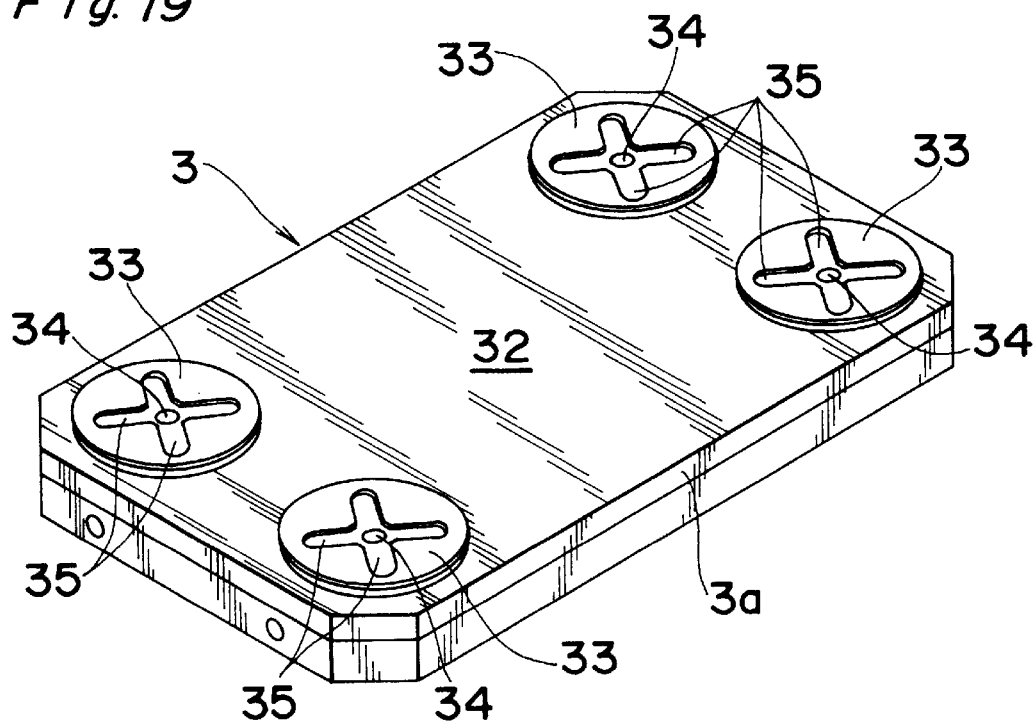
FIG. 19 is a perspective view of a panel placing plate of a holding means in an electronic component mounting apparatus according to a fourth embodiment of the present invention.
Figure 20:
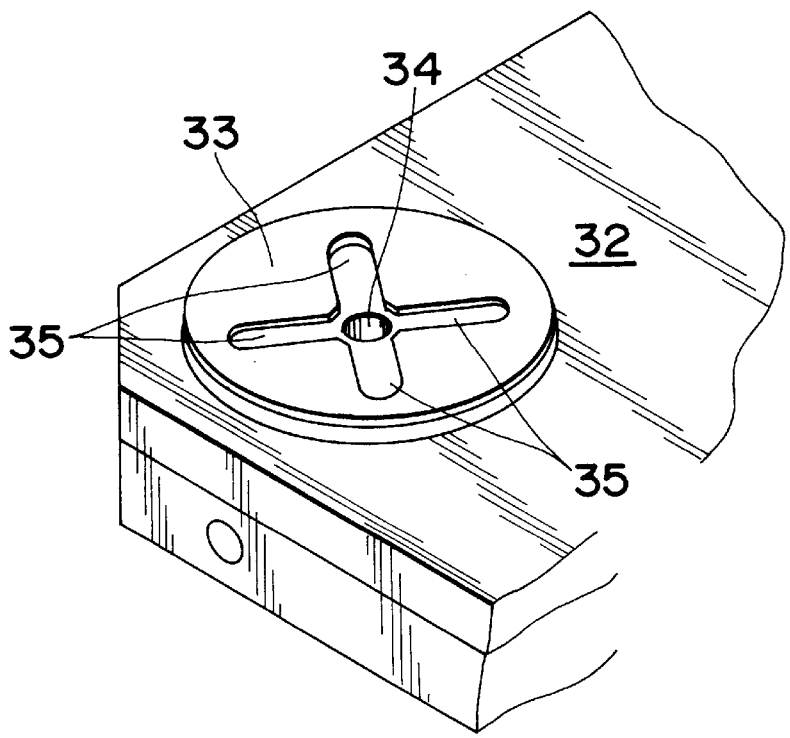
FIG. 20 is an enlarged perspective view of a suction pad in the fourth embodiment.

Although there are the four radial grooves 35 formed from the center of each suction pad 33 in the fourth embodiment shown in FIGS. 19 and 20, three radial grooves are sufficient so long as the necessary opening area is secured without increasing the groove width too much, or five or more grooves may be provided when necessary.

Figure 22A:
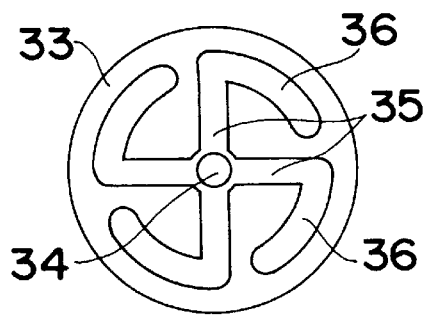
FIGS. 22A, 22B, 22C, and 22D are plan views of modified suction pads of the fourth embodiment.
Figure 22B:
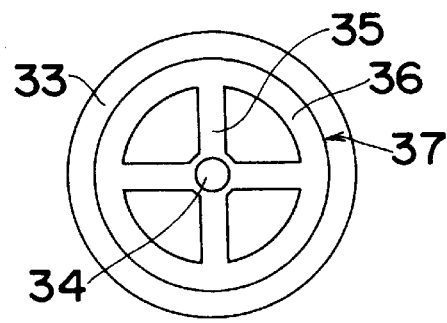
Figure 22C:
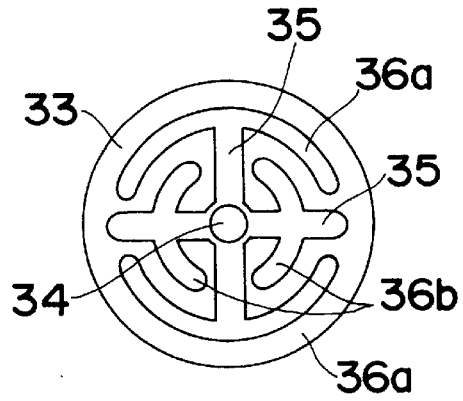
Figure 22D:
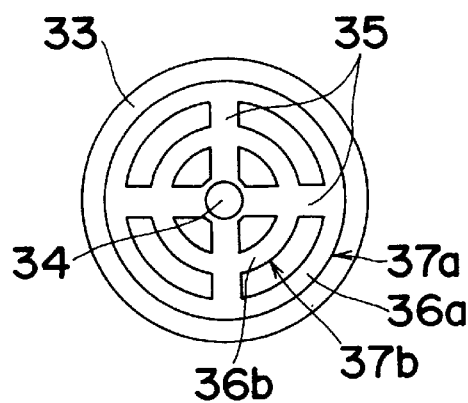

Modified examples of the suction pad 33 of the holding means 3 are illustrated in FIGS. 22A–22D. A common feature of these modified examples is a suitably combined use of circular-arc grooves 36 with the radial grooves 35 of FIGS. 19 and 20. More specifically, in an example of FIG. 22A, circular-arc grooves 36 continue from front ends of the corresponding radial grooves 35 in the same direction. In FIG. 22B, the circular-arc grooves 36 continuing from front ends of the radial grooves 35 are connected to form a loop groove 37 as a whole. In FIG. 22C, approximately-semi-circular-arc grooves 36a are continuously formed from the front ends of a pair of radial grooves 35 in the diametrical direction, while approximately-semi-circular-arc grooves 36b are continuously extended from the middle portions of another pair of radial grooves 35 in the diametrical direction. In FIG. 22D, double loop grooves 37a and 37b are obtained by connecting the semi-circular-arc grooves 36a and 36b of FIG. 22C respectively. A combination of the radial grooves 35 and circular-arc grooves 36, 36a, and 36b may be set optionally, not limited to the foregoing examples.

In the suitably combined use of the radial grooves 35 and circular grooves 36, 36a, 36b in the modifications, the necessary opening area is secured without greatly changing the size of the suction pad 33, exerting the effects discussed above.

Although the suction pad 33 of the holding means 3 is a circle in the above fourth embodiment, any optional shape such as a rectangle or the like is applicable. At the same time, although the radial grooves 35 are formed on the upper surface of the suction pad 33 according to the fourth embodiment and its modifications, the shape and arrangement of the grooves may be determined optionally so long as the width of the recessed part at the upper surface of the suction pad 33 is not larger than 8 times, more suitably 3–5 times the thickness of the glass panel 2 to be held.

Figure 23:
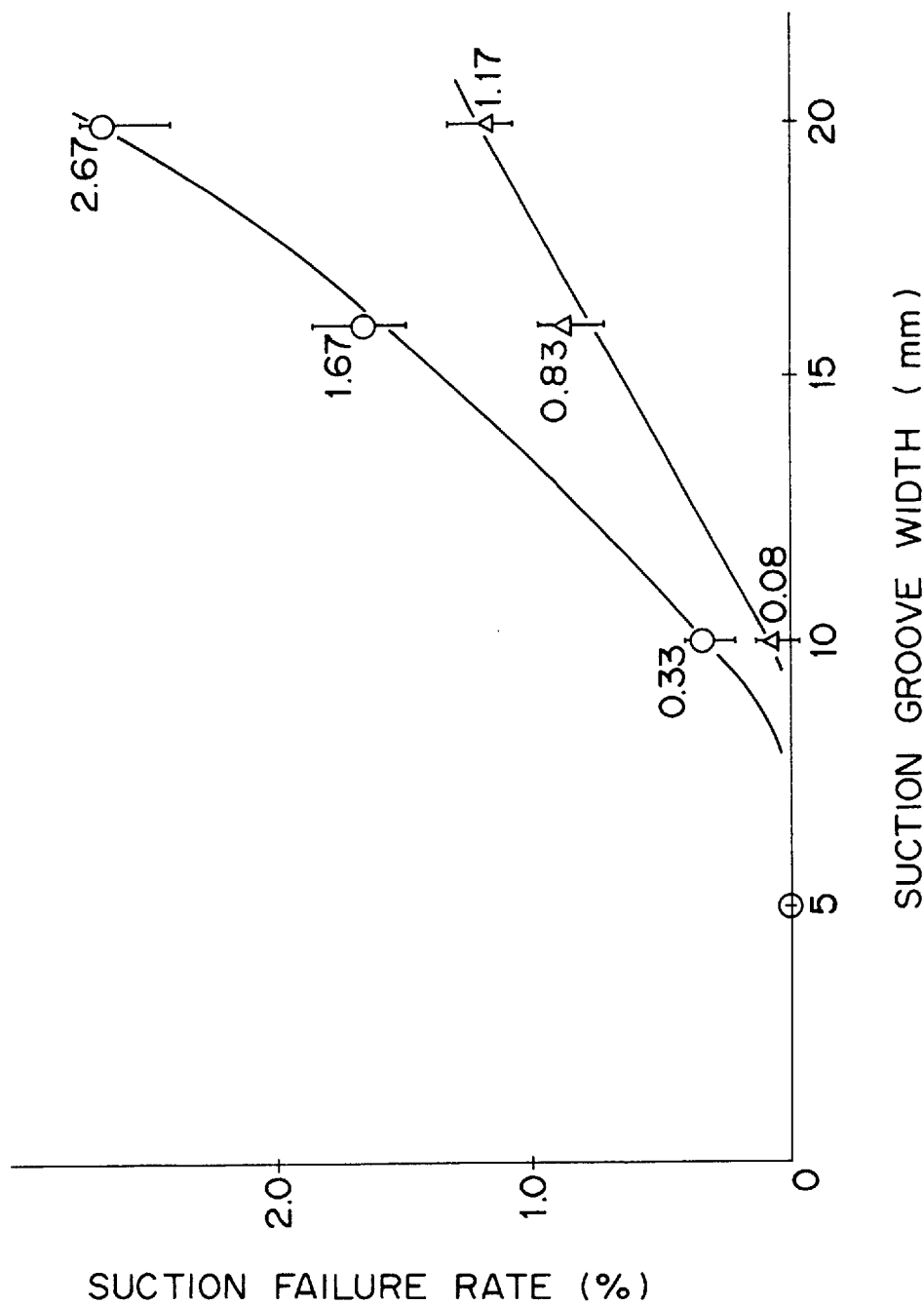
FIG. 23 is a graph indicating the relationship between the width of a suction groove and the suction failure rate.

FIG. 23 shows the relationship between the width of the groove and the suction failure rate when the vacuum pressure is −450 mmHg, sucking time is 90 sec, and the thickness of the glass panel is 0.7 mm (indicated by ○ symbol) and 1.1. mm (indicated by Δ symbol). If the glass panel 2 is 1.1 mm thick, the width of the groove is desirably 1.1×8=8.8 mm or smaller, more favorably, 1.1×(5−3)=5.5−3.3 mm. The suction failure includes a case where the glass panel cannot be sucked and also a case where the suction pad leaves a suction trace on the glass panel 2.

As is clear from the above description of the fourth embodiment, since the width of the recessed part at the upper surface of the suction pad 33 is not larger than 8 times, more preferably, 3–5 times the thickness of the glass panel 2, even if the suction force of the suction pad 33 adds a bending load to a portion of the glass panel 2 facing the upper opening, the bending stress and distortion of the glass panel is suppressed owing to the small distance between edges of the upper opening, unlike when the circular or rectangular recess is formed, thereby eliminating the quality failure resulting from the deformation of the glass panel 2. Moreover, because of the wide area of the contact face between the suction pad 33 and glass panel 2 in the periphery of the grooves, a large friction force is ensured, whereby the glass panel is securely held and prevented from shifting.

Although the groove may be formed in any shape, when the suction port is formed at the center of the suction pad and radial grooves are extended from the center of the suction port, it can further prevent the positional shift of the glass panel because the friction force against the positional shift of the glass panel effectively operates in every direction.

When the radial grooves are used in combination with the circular grooves, the necessary area of the upper opening is obtained without enlarging the suction pad while the above effects are ensured.

A fifth embodiment of the present invention will now be described below.

According to the fifth embodiment, a pair of reference position marks of the glass panel 2 are recognized, and the mounting position data for each electronic component 1 is corrected based on the recognized positions of the pair of reference position marks and a recognized value of the distance between the pair of reference position marks. A mounting process in the fifth embodiment is carried out in the manner as above, without performing the registration of the mounting position marks 2b and positioning marks 1e.

The mounting process for the electronic component(s) 1 to the glass panel 2 in the fifth embodiment will be described with reference to FIGS. 1, 2, and 24–26. In the first place, the mounting head 7 is moved to the feeding position 6 and the position of the electronic component 1 is recognized by the recognizing camera 80 of the mounting head 7 (referring to FIG. 14) (step S21 in a flow chart of FIG. 24). The mounting head 7 is positioned with the electronic component 1 (step S22), so that the electronic component 1 is properly sucked by the mounting head 7 (step S23). Then, the mounting head 7 is moved over a recognizing camera which is the auxiliary image recognizing means 19, and positioning marks 1e at the right and left sides of the electronic component 1 are recognized by the camera 19. The position of the sucked electronic component 1 is correctly recognized.

Figure 24:
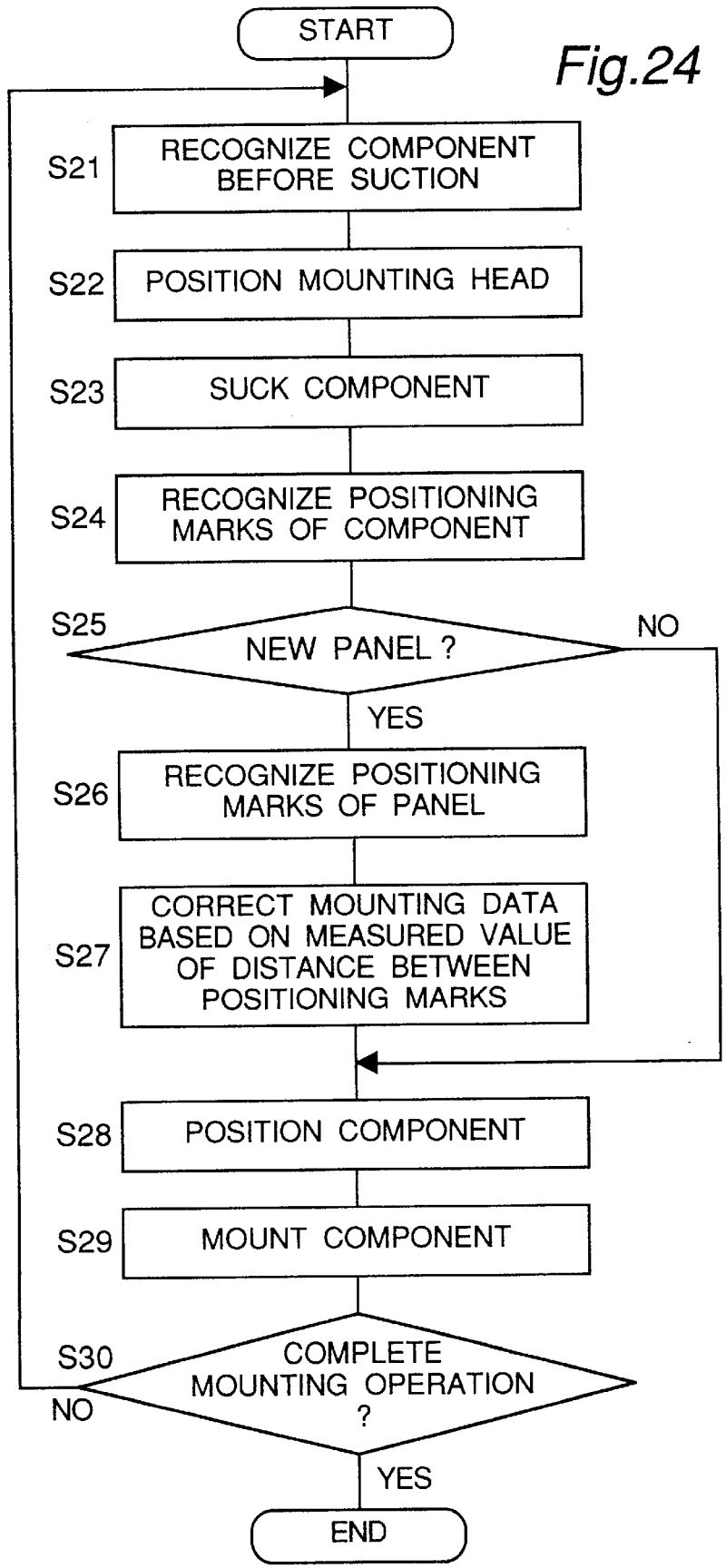
FIG. 24 is a flow chart of an operation in an electronic component mounting method according to a fifth embodiment of the present invention.
Figure 25:
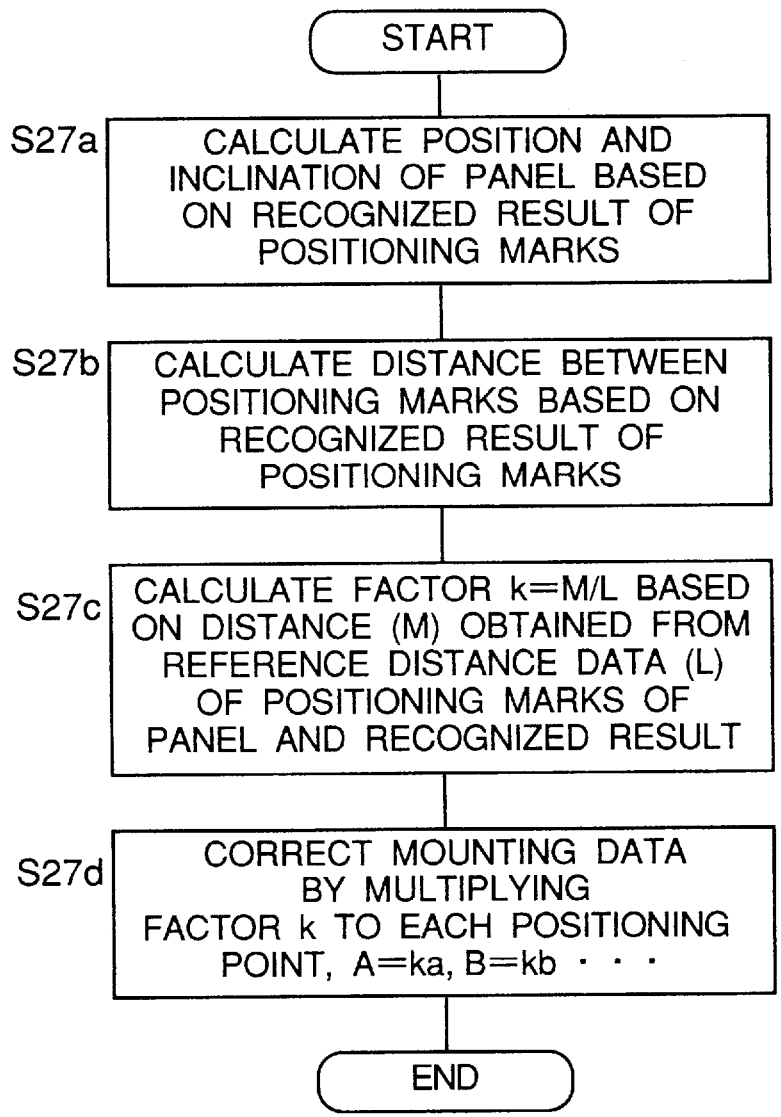
FIG. 25 is a detailed flow chart of an operation in a mounting data correcting step S27 of the fifth embodiment.
Figure 26:
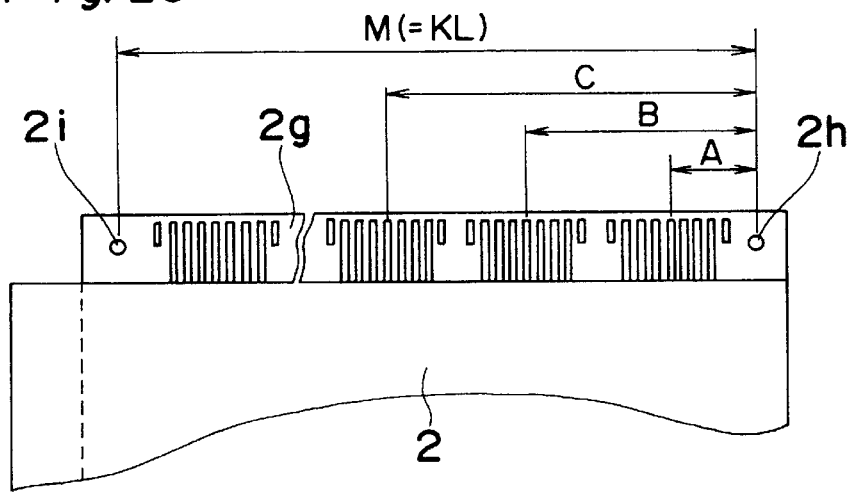
FIG. 26 is an enlarged plan view of one side of a glass panel for explaining the correction of the mounting position data in the mounting method of the fifth embodiment.
Figure 27:
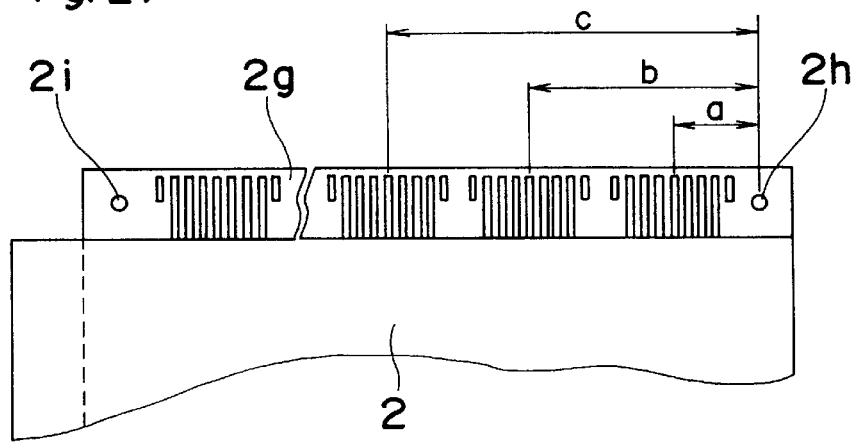
FIG. 27 is an enlarged plan view of one side of a glass panel for explaining the correction of the mounting position data in a conventional mounting method.

Subsequently, it is detected whether a new glass panel 2 is supplied onto the holding means 3 (step S25). If a new glass panel 2 is supplied, as indicated in FIG. 24, a pair of reference position marks 2h and 2i formed at both ends of the side 2g of the new glass panel 2 where the electronic component(s) is to be mounted are recognized by the recognizing camera 80 of the mounting head 7 (step S26). The mounting data for the electronic component 1 is corrected based on the recognized position of each of the reference position marks 2h and 2i (step S27). More specifically, referring to FIG. 25, the mounting position data for each electronic component 1 is distances a, b, c, . . . from a reference position denoted by the reference position mark 2h as is shown in FIG. 27. The reference position in the mounting data is corrected on the basis of the recognized position of the reference position mark 2h, and at the same time, an inclination of the glass panel 2 is detected from the recognized positions of each reference position mark 2h, 2i (step S27a in FIG. 25). A recognized value M of the distance between the reference position marks 2h and 2i is obtained from the recognized position of each mark (step S27b in FIG. 25). Further, a shrinkage factor k is calculated from the recognized value M and a distance L in the mounting data between the reference position marks 2h and 2i according to an equation M=kL (step S27c in FIG. 25). The mounting position data for each electronic component 1 is positions of distances A=ka, B=kb, C=kc, . . . in the inclining direction of the glass panel 2 from the reference position which is the recognized position of the reference position mark 2h (step S27d of FIG. 25).

The mounting head 7 is positioned based on the mounting position data of the electronic component 1 obtained as above, whereby the electronic component 1 sucked by the tool 9 is correctly positioned at the mounting position (step S28 of FIG. 24). Needless to say, a correction of the electronic component 1 based on the suction position is conducted at this time. Thereafter, when the tool 9 is descended, the electronic component 1 is pressed to the glass panel 2 via the ACF 25 and finally mounted to the glass panel 2 (step S29). The procedure is repeatedly performed until mounting is completed to every required side of the glass panel (step S30).

When a new glass panel 2 is not supplied in step S25, since the mounting data is already corrected, steps S26 and S27 are not needed, and then the process goes straight from step S25 to step S28 to position the electronic component.

The correcting process in the fifth embodiment is executed by the controlling means 70 connected to each image recognizing means and various other means.

As described hereinabove, the mounting position data for each electronic component 1 is corrected based on the recognized position of the pair of reference position marks 2h and 2i and the recognized value of the distance between the marks 2h and 2i. Therefore, even if an error due to the thermal shrinkage caused by the heat generated when the moving mechanism of the mounting head 7 operates or the change of the ambient temperature is brought about, or even when a shrinking error of patterns is detected among lots of glass panels 2, the error is properly corrected to mount each electronic component 1 highly accurately. Accordingly, the registering accuracy is improved to ±10 μm or smaller, making it possible to mount the electronic component 1 of approximately 80 μm minimum lead pitch. In comparison with the method whereby the mounting position marks 2e of the glass panel 2 formed at the mounting position are registered with the positioning marks 1e of the electronic component 1 to enhance the mounting accuracy as discussed in the first through third embodiments, the fifth embodiment shortens the tact time, thereby improving the productivity.

According to the mounting method of the fifth embodiment, the mounting position data is corrected from the recognized position of the pair of reference position marks formed in the glass panel and the recognized value of the distance between the marks. Even if the thermal shrinkage due to the heat generated by the action of the moving mechanism or the change of the ambience temperature causes an error, or if a shrinking error of patterns is generated among the lots of glass panels, the error is properly corrected, whereby the electronic component(s) is mounted highly accurately. It is enough in the fifth embodiment only to recognize the pair of reference position marks even when the glass panel is exchanged, similar to the prior art method, whereby the tact time for mounting the electronic component(s) is shortened.

Since the mounting pattern is formed accurately in the glass panel constituting a liquid crystal panel, the embodiment strongly shows the above-discussed effect and produces a highly accurate liquid crystal panel efficiently at low cost.

A sixth embodiment of the present invention will be explained.

The sixth embodiment uses the reversing means 21 or 22 and holding means 3 in order to control the posture of the glass panel 2. A mounting process wherein electronic component(s) 1 are sequentially mounted along a side of the glass panel 2 after the side is positioned at a predetermined position will be discussed as one BLOCK in the following description.

In the mounting process, for each electronic component mounting block, the mounting data for positioning a side of the glass panel 2 where the electronic component(s) 1 is to be mounted in the mounting apparatus is, as shown in FIG. 28, constituted of an X-coordinate data and a Y-coordinate data which are positioning coordinates for the holding means 3, a side data for specifying the side of the glass panel 2 where the electronic component(s) 1 are to be mounted, a face data for specifying the front or rear face of the glass panel to be mounted, and other data. The side data and face data are concretely coded by, for example, numeral 1 for an upper side, 2 for a right side, 3 for a lower side, 4 for a left side, 1 for the front surface, and 2 for the rear surface. The front surface of the upper side is accordingly represented by data of [11], the front surface of the lower side is represented by data of [31], and the rear surface of the right side is represented by data of [22].

Figure 29A:
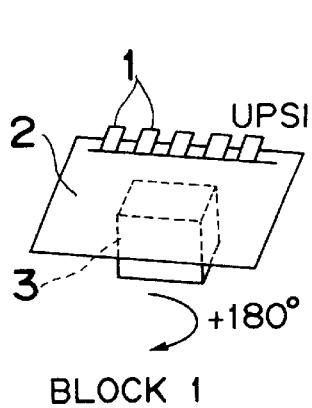
FIGS. 29A, 29B, and 29C are explanatory diagrams of a positioning operation for panel according to the mounting data of FIG. 28.
Figure 29B:
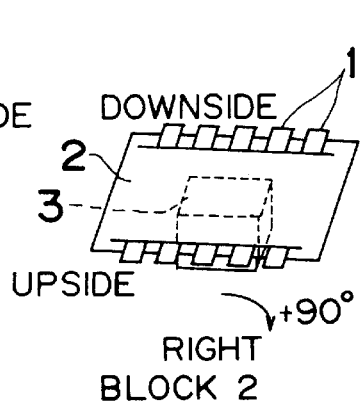
Figure 29C:
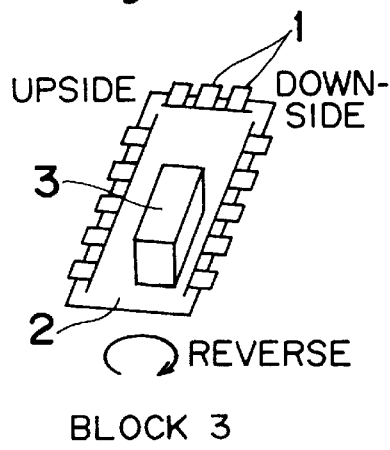

In FIGS. 29A–29C, in mounting the electronic components(s), based on the mounting data, a BLOCK 1 shows the mounting data [11] which means the front surface of the upper side and therefore, the front surface of the glass panel 2 is held in the up direction and the upper side of the glass panel 2 is positioned at a predetermined position by the holding means 3 as in FIG. 29A. Then, the electronic component(s) 1 is mounted along the upper side. At a BLOCK 2, the mounting data is [31] which means the front surface of the lower side, whereby the holding means 3 is rotated 180° thereby to position the lower side of the glass panel 2 at the predetermined position, and then, the electronic component(s) 1 is mounted along the lower side, as shown in FIG. 29B. At a BLOCK 3 shown in FIG. 29C, the mounting data indicates the right side and rear surface, namely, [22], whereby the holding means 3 is rotated 90° as shown in FIG. 29C thereby to reverse the glass panel 2 by the reversing means 21 or 22. In other words, the sixth embodiment uses the side data specifying a side of the glass panel 2 where the electronic component(s) 1 is to be mounted as the mounting data to position the side at the predetermined position. The holding means 3 or the reversing means 21 or 22 is regulated by the current side data and a side data for a side to be mounted at a next step.

Figure 30:
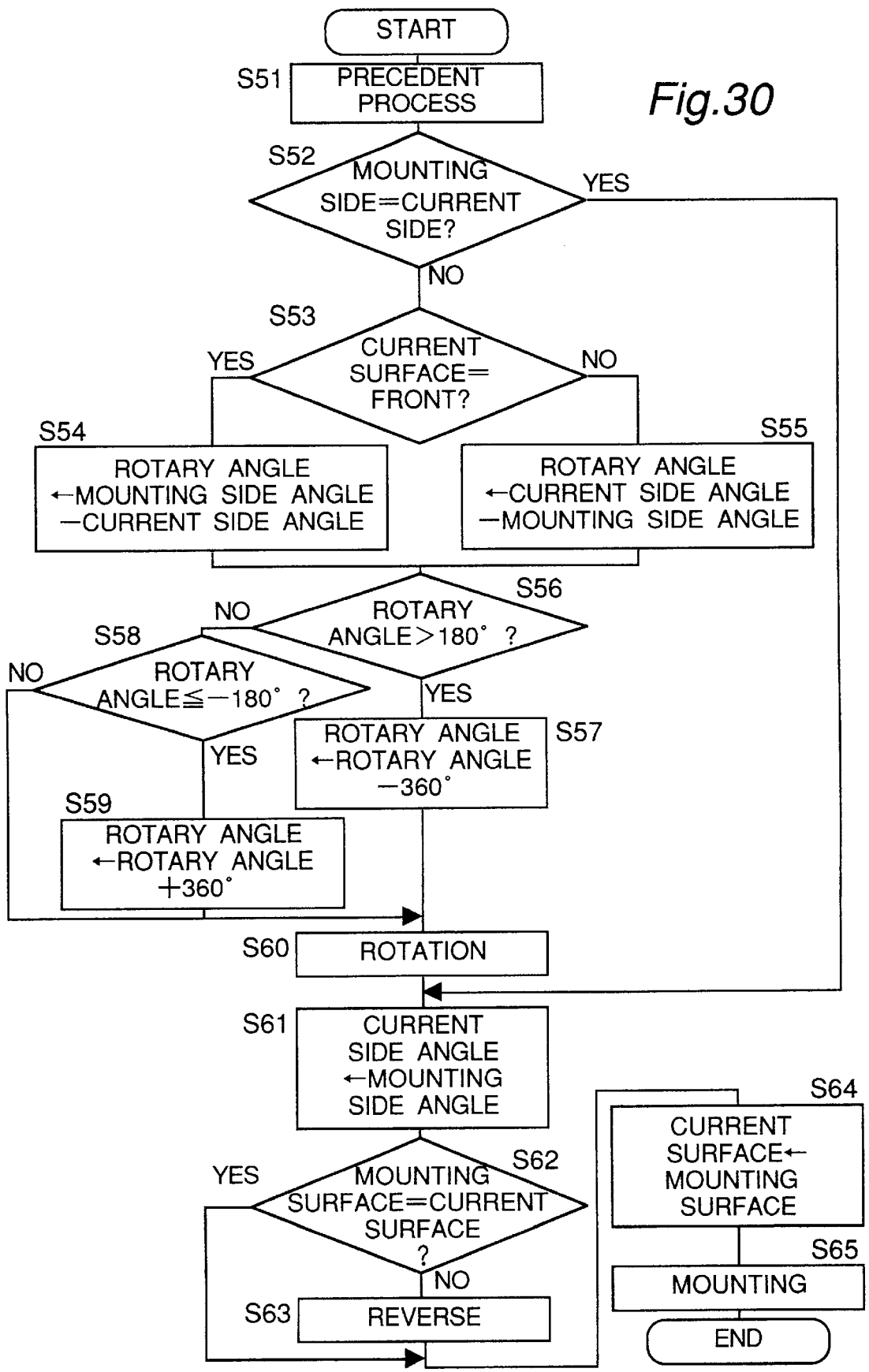
FIG. 30 is a flow chart of a controlling operation of a panel posture controlling means in an electronic component mounting apparatus of the sixth embodiment.
Figure 31:
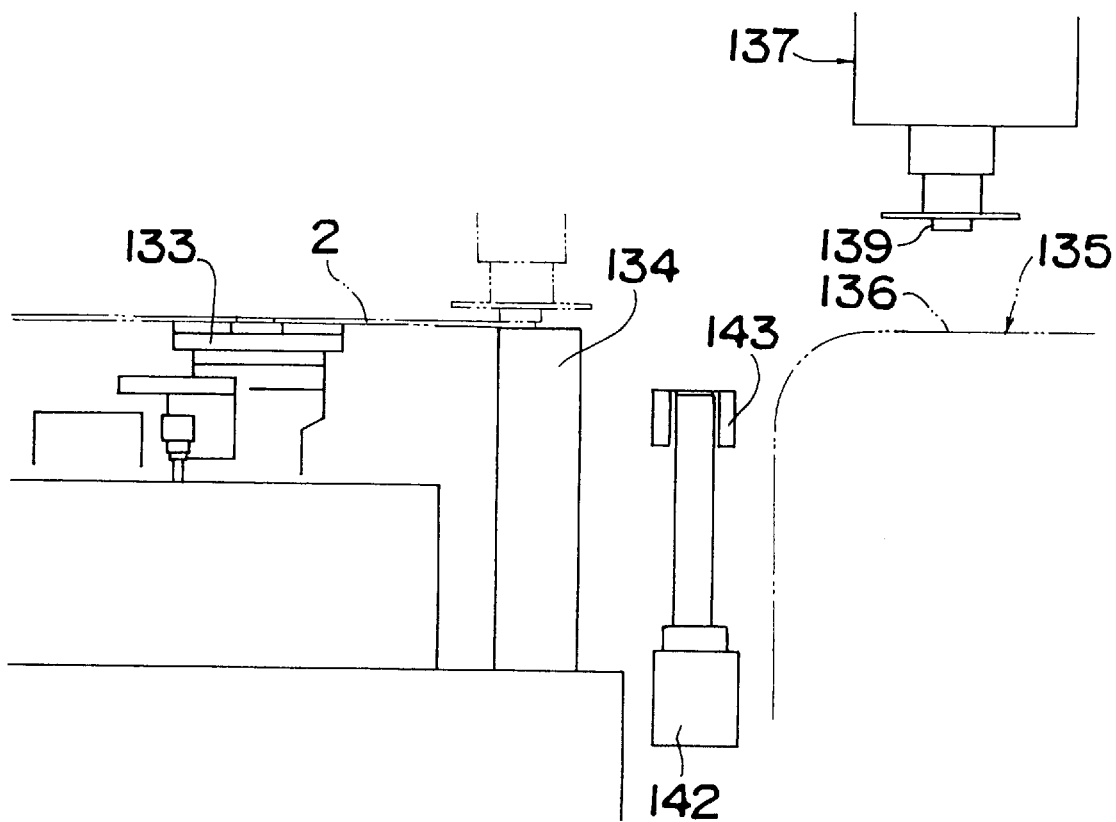
FIG. 31 is a schematic structural diagram of part of a conventional electronic component mounting apparatus.
Figure 32:
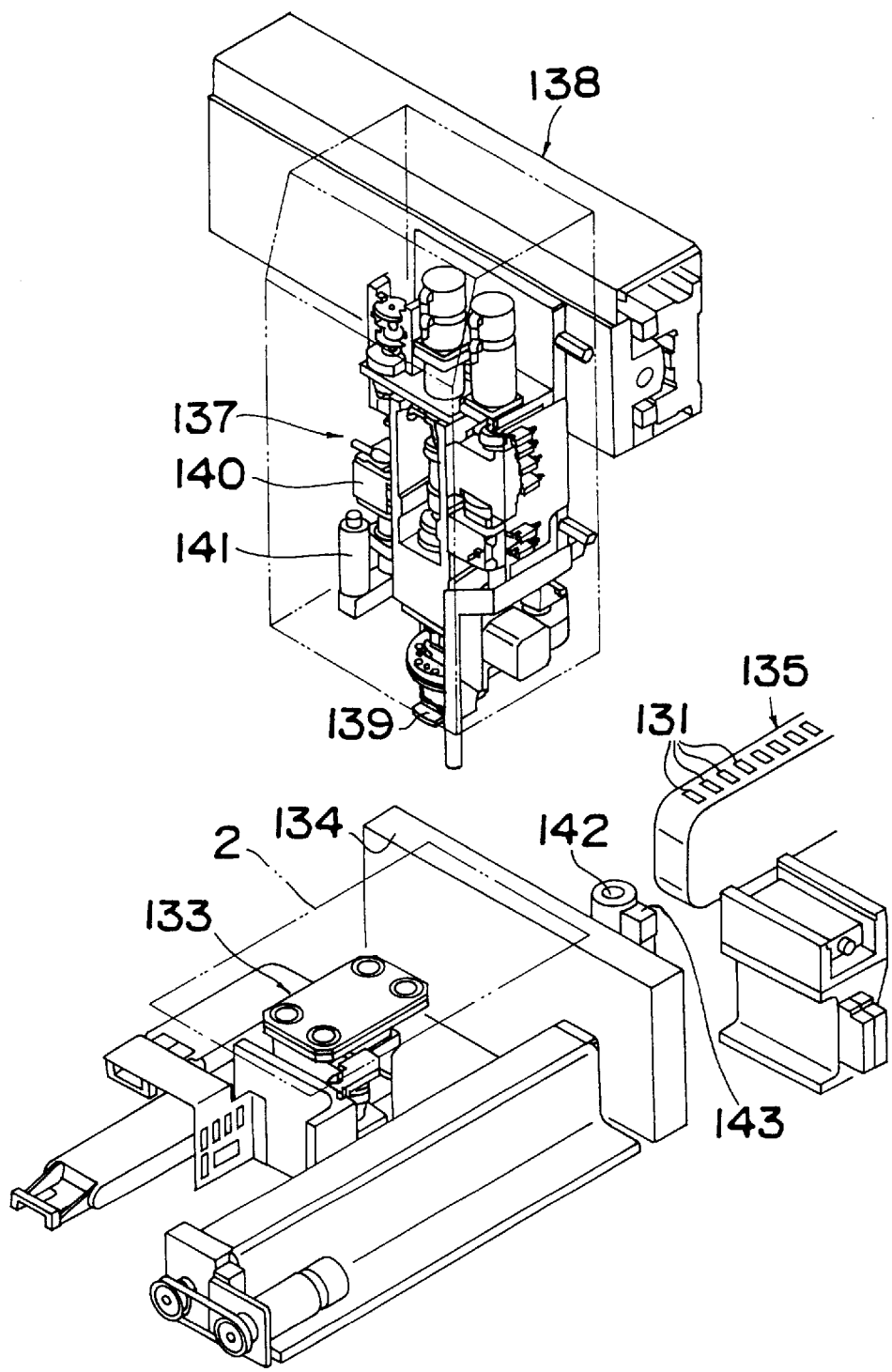
FIG. 32 is a perspective view of part of the conventional apparatus.
Figure 33:
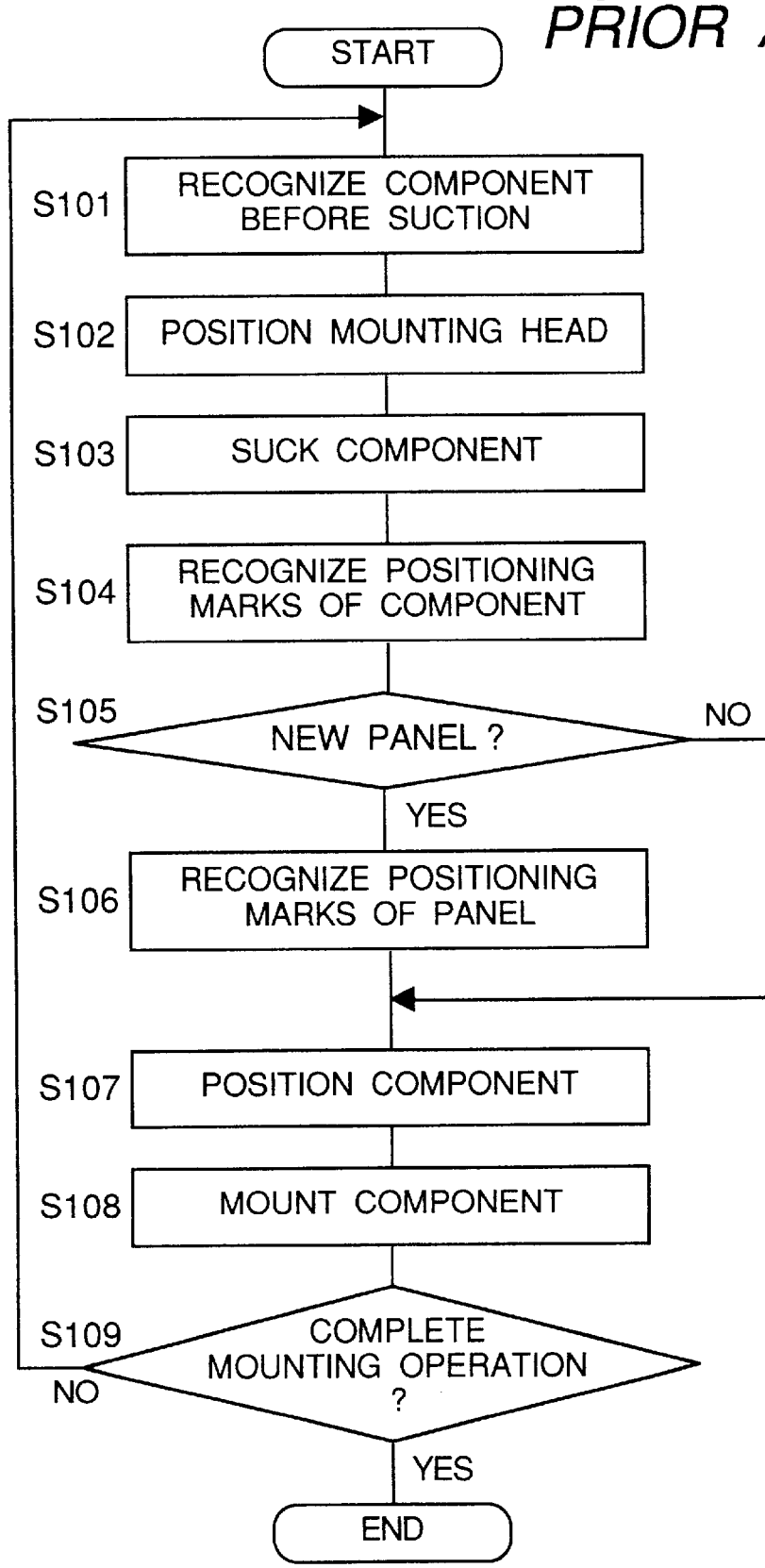
FIG. 33 is a flow chart of a mounting operation in the conventional apparatus.
Figure 34:
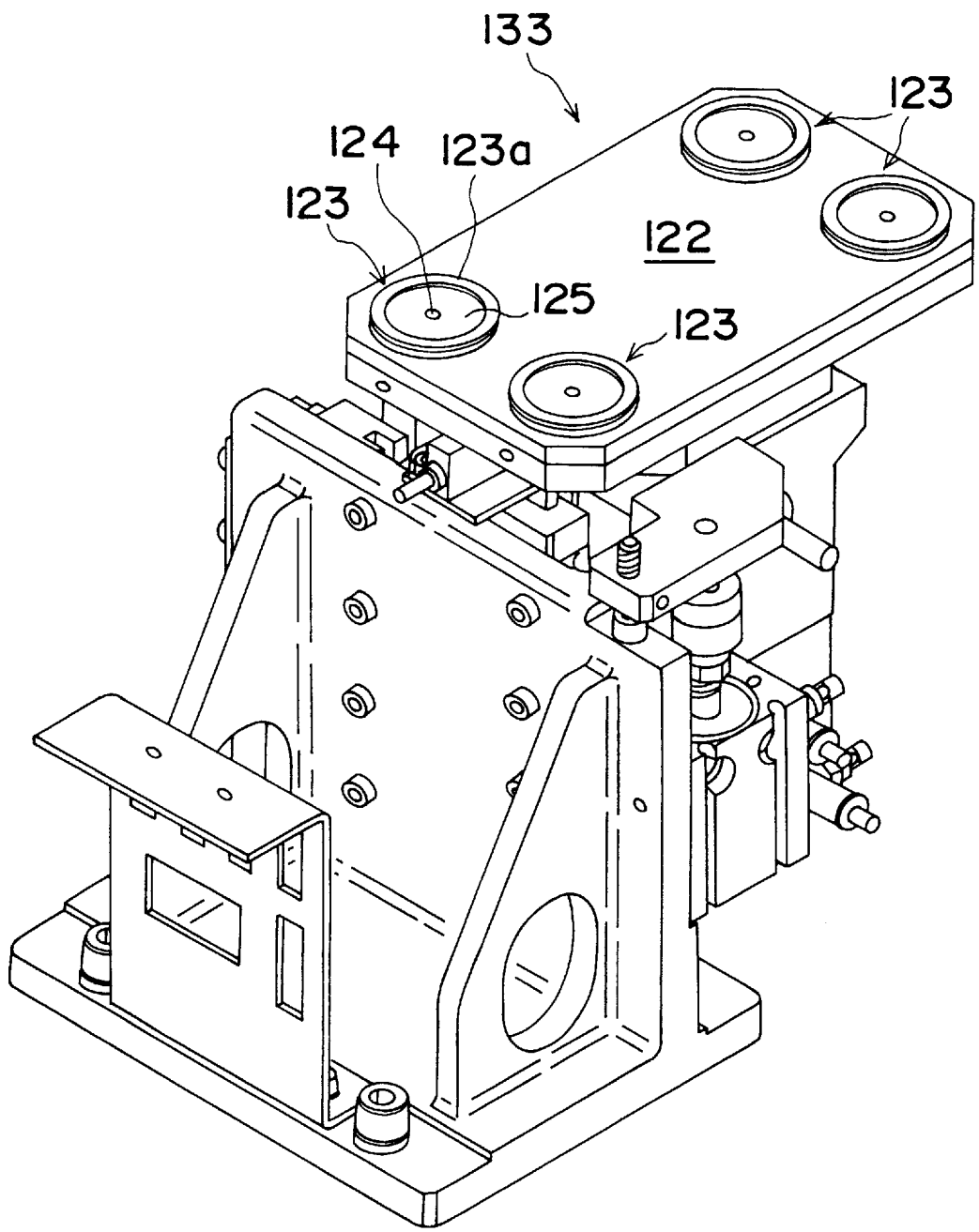
FIG. 34 is a perspective view of a conventional panel holding means.
Figure 36A:
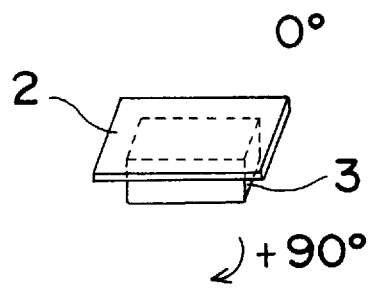
FIGS. 36A, 36B, 36C, and 36D are explanatory diagrams of a positioning operation of the panel according to the mounting data of FIG. 35.
Figure 36B:
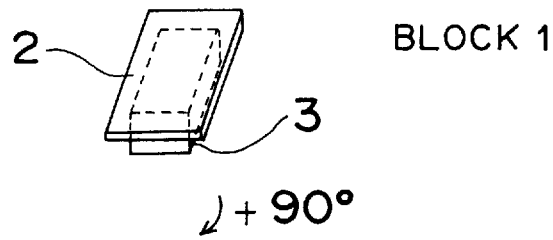
Figure 36C:
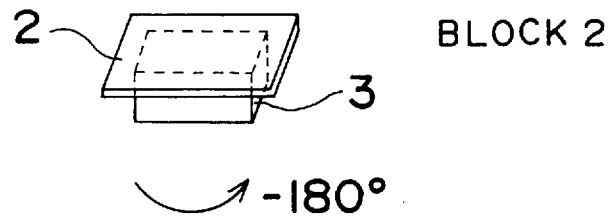
Figure 36D:
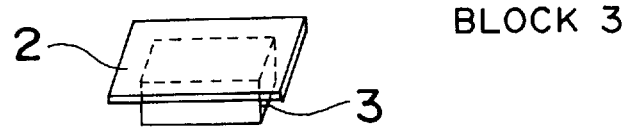

The controlling means 70 controls the operation of the holding means 3 and reversing means 21 or 22 based on the mounting data to perform the control of the glass panel posture. A controlling operation of the controlling means 70 will now be described with reference to FIG. 30. The side data is converted to a side angle before use, for instance, from the upper side [1] to 0°, from the right side [2] to 90°, from the lower side [3] to 180°, and from the left side [4] to 270°.

Upon completion of the pretreatment such as the carry-in step of the glass panel 2 or the mounting step to the precedent BLOCK, etc. (step S51), it is detected whether a mounting side to be mounted at the next step agrees with the current side (step S52). If the sides agree, the process moves to step S61. If the mounting side is different from the current side, the glass panel 2 is rotated predetermined angles. Since the rotating direction is opposite when the current surface is front to when the current surface is rear, it is detected whether the current surface is front or rear before rotating the glass panel 2 (step S53). In the case of the front surface, a value obtained by subtracting the current side angle from the mounting side angle is set as a rotary angle (step S54). If the current surface is the rear face, a value obtained by subtracting the mounting side angle from the current side angle is used as a rotary angle (step S55). If the rotary angle is larger than 180°, it is better to rotate the glass panel 2 in the reverse direction to select the smaller rotary angle. Therefore, whether the rotary angle is larger than 180° is detected (step S56). When the rotary angle is larger than 180°, a value subtracted 360° from the rotary angle is made a rotary angle (step S57). If the rotary angle is not larger than 180°, it is detected whether the rotary angle is −180° or smaller (step S58). When it is not larger than −180°, a value added 360° to the rotary angle is a rotary angle (step S59). If the rotary angle is larger than −180°, the angle is used as it is. The holding means 3 is rotated by the thus-obtained rotary angle (step S60). The detected mounting side angle is made a current side angle for a succeeding step (step S61).

It is detected whether the mounting surface agrees with the current surface (step S62). Only when the mounting surface does not agree with the current surface, the glass panel 2 is reversed by the reversing means 21 or 22 (step S63) and thereafter, the mounting surface is rendered a current surface (step S64). The electronic component(s) 1 is mounted to the side of the mounting surface (step S65). By repeating the above procedure, a desired side of the glass panel 2 is positioned at the predetermined position to mount the electronic component(s) 1.

According to the above sixth embodiment, the side data is used as the mounting data. Therefore, it is possible to form the mounting data by converting data of an actual article or drawings with 1:1, virtually directly from a CAD data. It is also possible to form a reversed mounting data in accordance with the rotation of the glass panel 2. The mounting data is considerably simply formed in the sixth embodiment. When the mounting data is input to the controlling means 70, the controlling means 70 determines the rotary angle or the reversal of the glass panel 2 based on the current side data and a side data for a next side of the glass panel, thereby controlling the positioning means. Accordingly, a side of the glass panel 2 where the electronic component(s) 1 is to be mounted is positioned at a predetermined position.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A method for mounting an electronic component onto a transparent panel, comprising:

picking up the electronic component at an electronic component feeding part;

positioning and mounting the component at a predetermined mounting position on the transparent panel, said positioning and mounting of the component comprising registering mounting position marks formed at the mounting position of the transparent panel with positioning marks indicated on the electronic component, to thereby recognize a position of the electronic component relative to the transparent panel by viewing the electronic component through the transparent panel from a side of the transparent panel opposite to a mounting surface of the transparent panel, so that a position of the electronic component is corrected based on a result of the recognition before the electronic component is mounted to the mounting position of the panel;

recognizing a position of the electronic component held at the feeding part during transfer to the mounting position before the mounting position marks and positioning marks are recognized;

recognizing a pair of reference position marks indicating a reference mounting position and formed in the panel;

correcting a mounting position data for the electronic component from recognized positions of the pair of reference position marks and recognized value of a distance between the reference position marks;

correcting the position of the electronic component based on a recognition result of a held position of the electronic component relative to a corrected mounting position, and thereby positioning the electronic component at the mounting position; and then, mounting the electronic component on the transparent panel.

2. The mounting method according to claim 1, wherein in said positioning and mounting of the component on the transparent panel, the transparent panel is a glass panel constituting a liquid crystal panel.

3. A method for mounting an electronic component onto a transparent panel, comprising:

picking up the electronic component at an electronic component feeding part;

positioning and mounting the component at a predetermined mounting position on the transparent panel, said positioning and mounting of the component comprising registering mounting position marks formed at the mounting position of the transparent panel with positioning marks indicated on the electronic component, to thereby recognize a position of the electronic component relative to the transparent panel by viewing the electronic component through the transparent panel from a side of the transparent panel opposite to a mounting surface of the transparent panel, so that a position of the electronic component is corrected based on a result of the recognition before the electronic component is mounted to the mounting position of the panel; and wherein, in mounting the electronic component by positioning an optional side of the panel at the predetermined mounting position, a side data specifying each side of the panel is used as the mounting data, to thereby control rotation or reversal of the panel based on the side data used in a current mounting process and a side data for a side to be processed at a next mounting process.

4. An apparatus for mounting an electronic component onto a transparent panel having first and second opposite surfaces, said apparatus comprising:

a feeding means for feeding the electronic component to a predetermined position for suction;

a holding means for holding the transparent panel where the electronic component is to be mounted and positioning the panel at a predetermined position for mounting;

a mounting head for holding by suction and transferring the fed electronic component to mount the component at a mounting position on the first surface of the transparent panel;

an image recognizing means for viewing, through the transparent panel, an image on a first surface side of the transparent panel from a position on a second surface side of the transparent panel immediately below the mounting position on the transparent panel for each electronic component; and illuminating means for selectively casting a coaxial light and a scattered light as an illuminating light for recognition.

5. The mounting apparatus according to claim 4, wherein said holding means securely holds the transparent panel at the predetermined position for mounting, and said mounting apparatus further comprises a moving body which is movable in a direction parallel to the mounting position on the transparent panel and to which said image recognizing means and said illuminating means are mounted.

6. The mounting apparatus according to claim 5, further comprising an auxiliary image recognizing means for recognizing a held position of the electronic component when disposed in a middle portion of a transfer path of the mounting head.

7. An apparatus for mounting an electronic component onto a transparent panel having first and second opposite surfaces, said apparatus comprising:

a feeding means for feeding an electronic component to a predetermined position for suction;

a holding means for holding the transparent panel where the electronic component is to be mounted and positioning the panel at a predetermined position for mounting;

a mounting head for holding by suction and transferring the fed electronic component to mount the component at a mounting position on the first surface of the transparent panel;

a first image recognizing device for viewing, through the transparent panel, an image on a first surface side of the transparent panel from a position on a second surface side of the transparent panel immediately below the mounting position on the transparent panel;

a coaxial light casting device positioned on the second surface side of the transparent panel immediately below the mounting position on the transparent panel;

a second image recognizing device and a scattered light casting device positioned in the vicinity of the first image recognizing device.

8. The mounting apparatus according to claim 7, wherein said holding means securely positions the transparent panel at the predetermined position for mounting, and said mounting apparatus further comprises a moving body which is movable in a direction parallel to the mounting position on the transparent panel and to which said first image recognizing device, said coaxial light casting device, said second image recognizing device and said scattered light casting device are mounted.

9. The mounting apparatus according to claim 8, wherein said coaxial light casting device comprises an illuminating means for selectively casting a coaxial light and a scattered light as an illuminating light for recognition.

10. The mounting apparatus according to claim 4, further comprising a pair of reversing means for reversing the transparent panel, said reversing means being disposed at both sides of said holding means, and a transferring means for transferring the transparent panel between said holding means and said reversing means.

11. The mounting apparatus according to claim 7, further comprising a pair of reversing means for reversing the transparent panel, said reversing means being disposed at both sides of said holding means, and a transferring means for transferring the transparent panel between said holding means and said reversing means.

12. The mounting apparatus according to claim 4, wherein said holding means has a plurality of suction pads on a panel placing surface thereof onto which the transparent panel is to be placed, each suction pad having a recess formed at an upper surface thereof and being adapted for connection to a vacuum source, said recess being constituted of grooves of a width not larger than 8 times a thickness of the transparent panel and forming a compressed shut space when the transparent panel is held by suction.

13. The mounting apparatus according to claim 12, wherein, for each of said suction pads, a suction port is formed at a center of said suction pad, and said recess of said suction pad is constituted of three grooves radially extended from said suction port.

14. The mounting apparatus according to claim 13, wherein, for each of said suction pads, said recess of said suction pad is defined by a combination of said radial grooves and circular grooves continuous with said radial grooves.

* * * * *